United States Patent
Furuya et al.

(10) Patent No.: US 7,769,060 B1
(45) Date of Patent: Aug. 3, 2010

(54) LASER LIGHT SOURCE, AND DISPLAY DEVICE USING THE SAME

(75) Inventors: Hiroyuki Furuya, Nara (JP); Kiminori Mizuuchi, Osaka (JP); Kazuhisa Yamamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 321 days.

(21) Appl. No.: 12/066,548

(22) PCT Filed: Sep. 13, 2006

(86) PCT No.: PCT/JP2006/318186

§ 371 (c)(1),
(2), (4) Date: Mar. 12, 2008

(87) PCT Pub. No.: WO2007/032402

PCT Pub. Date: Mar. 22, 2007

(30) Foreign Application Priority Data

Sep. 14, 2005 (JP) .............................. 2005-266528

(51) Int. Cl.
*H01S 3/10* (2006.01)
(52) U.S. Cl. .......................................... 372/21; 372/20
(58) Field of Classification Search ................. 372/99, 372/50.1, 21, 23; 359/259
See application file for complete search history.

(56) References Cited

U.S. PATENT DOCUMENTS

| | | | | |
|---|---|---|---|---|
| 4,860,304 A | * | 8/1989 | Mooradian | .................... 372/92 |
| 5,256,164 A | * | 10/1993 | Mooradian | .................... 438/27 |
| 5,351,259 A | | 9/1994 | Ishimori et al. | ................ 372/75 |
| 5,574,740 A | | 11/1996 | Hargis et al. | .................. 372/41 |

(Continued)

FOREIGN PATENT DOCUMENTS

EP      0 867 991      9/1998

(Continued)

OTHER PUBLICATIONS

Helmfrid, S. et al, "Stable single-mode operation of intracavity-doubled diode-pumped Nd:YVO$_4$ lasers: theoretical study," J. Opt. Soc. Am. B, vol. 11, No. 3, Mar. 1994, pp. 436-445.

(Continued)

*Primary Examiner*—Minsun Harvey
*Assistant Examiner*—Tuan N. Nguyen
(74) *Attorney, Agent, or Firm*—Steptoe & Johnson LLP

(57) ABSTRACT

A laser light source having a semiconductor laser (102) for outputting pump light, and a laser resonator wherein a solid laser crystal (104) and a non-linear optical crystal (103) are connected by optical contact and a reflection coat (106) and a reflection coat (105) are on the opposed facets of the respective crystals. GdVO4 is the solid laser crystal (104) while LiNbO3 is the non-linear optical crystal (103), and the crystal axis of the solid laser crystal (104) is inclined with respect to the z axis of the non-linear optical crystal (103) within the z-x plane of the non-linear optical crystal (103). The thermal expansion coefficients of the solid laser crystal and of the non-linear optical crystal can be approximated to each other, thereby preventing separation of the bonded laser crystal and non-linear optical crystal due to different thermal expansion coefficients when heat is generated during laser oscillation, which stops laser oscillation.

23 Claims, 14 Drawing Sheets

U.S. PATENT DOCUMENTS

| | | | |
|---|---|---|---|
| 5,708,672 A * | 1/1998 | Pessot et al. | 372/23 |
| 5,838,709 A | 11/1998 | Owa | 372/68 |
| 6,587,496 B1 * | 7/2003 | Murray et al. | 372/70 |
| 2003/0147444 A1 | 8/2003 | Wada et al. | 372/70 |
| 2004/0233943 A1 | 11/2004 | Kezuka et al. | 372/21 |
| 2005/0073651 A1 | 4/2005 | Yamamoto | 353/20 |

FOREIGN PATENT DOCUMENTS

| | | |
|---|---|---|
| EP | 1 039 594 | 9/2000 |
| EP | 1 041 179 | 10/2000 |
| JP | 4-134891 | 5/1992 |
| JP | 5-87976 | 11/1993 |
| JP | 6-102553 | 4/1994 |
| JP | 06097563 | 4/1994 |
| JP | 6-268290 | 9/1994 |
| JP | 2000-315832 | 11/2000 |
| JP | 2004-111542 | 4/2004 |
| WO | WO2005/030980 | 4/2005 |

OTHER PUBLICATIONS

MacKinnon, N. et al, "A laser diode array pumped, Nd:YVO$_4$/KTP, composite material microchip laser," Optics Communications, vol. 105, 1994, pp. 183-187.

* cited by examiner

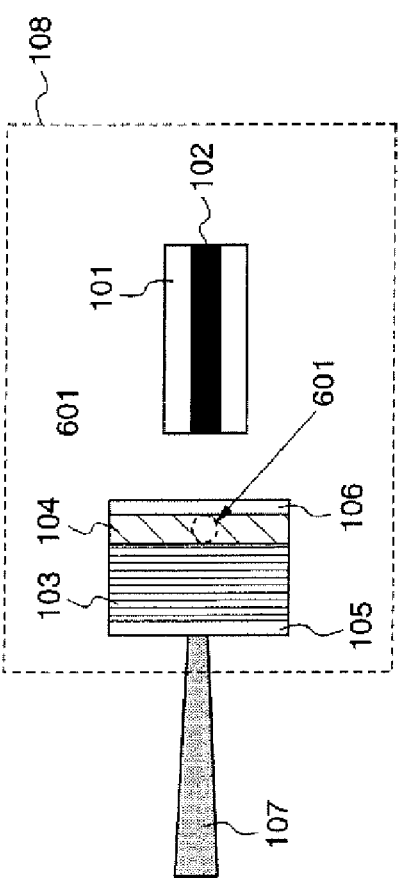
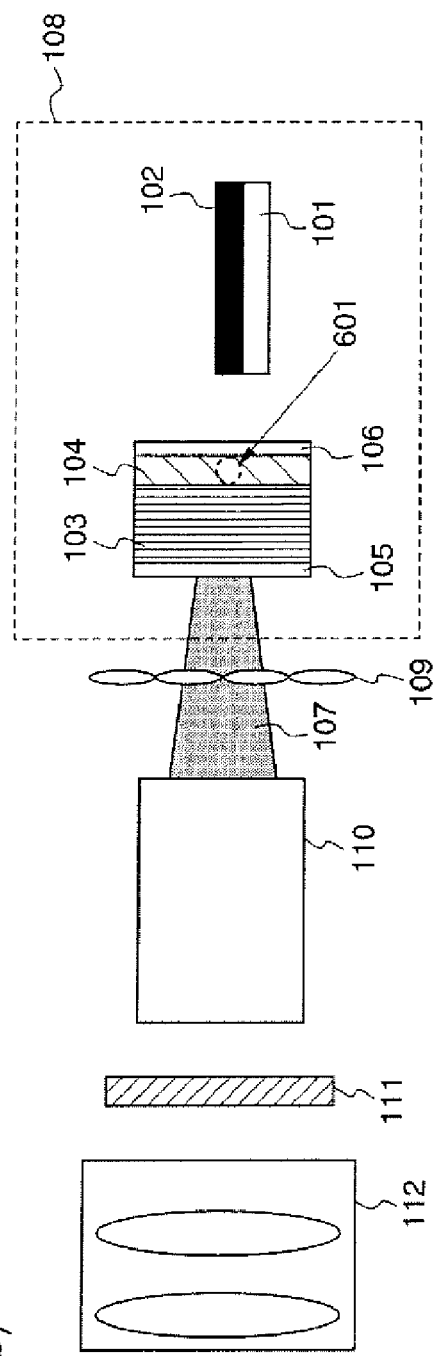
Fig.1(a)
Fig.1(b)

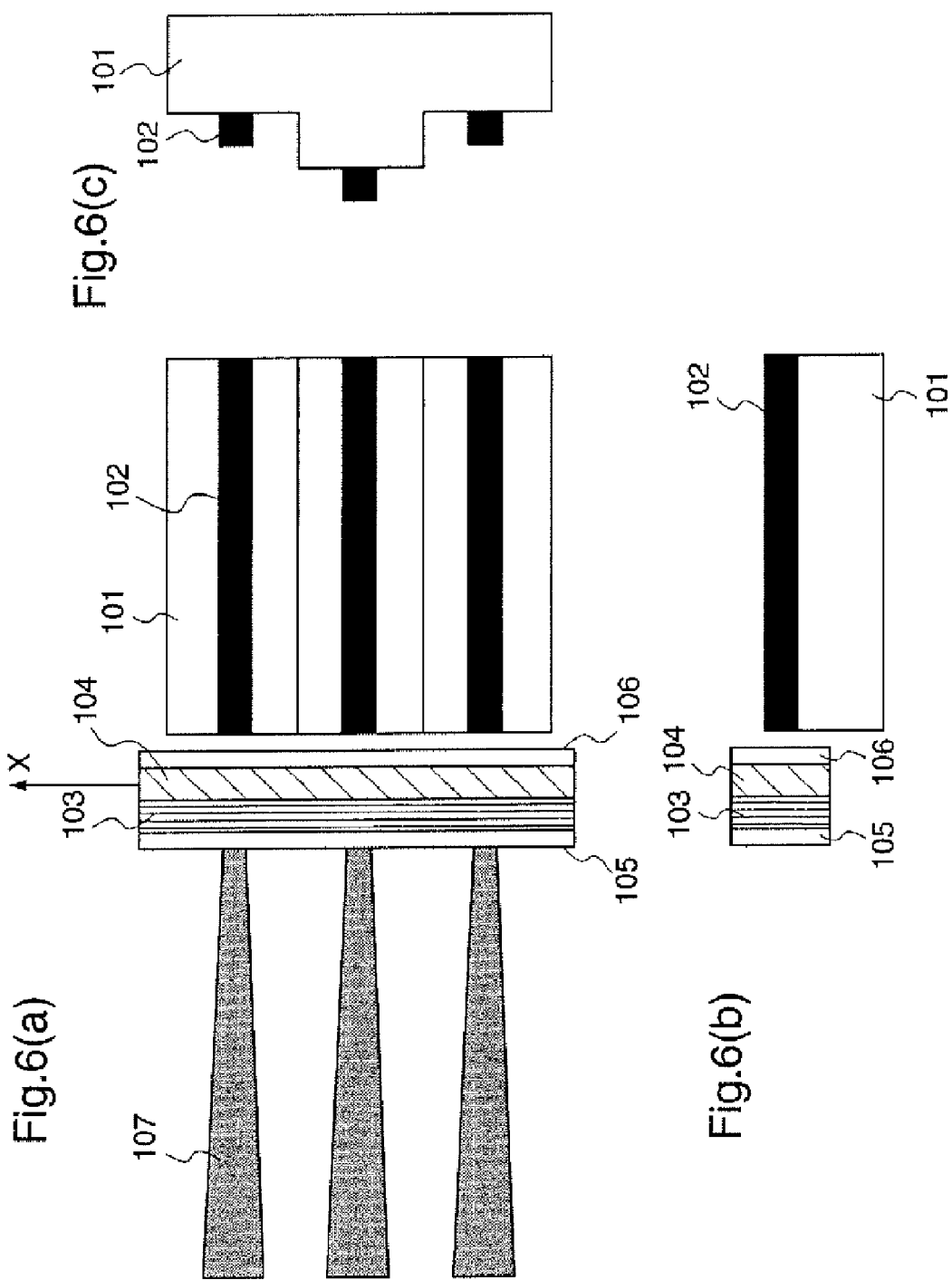

LASER LIGHT SOURCE, AND DISPLAY DEVICE USING THE SAME

The present application is based on International Application PCT/JP2006/318186 filed Sep. 13, 2006, which claims priority of Japanese Patent Application No. 2005-266528, filed Sep. 14, 2005.

TECHNICAL FIELD

The present invention relates to a microchip laser light source which operates at a high output power with stability, and a display device using the same.

BACKGROUND ART

A microchip laser using a solid laser realizes miniaturization of a light source. The microchip laser is a solid laser crystal to be pumped by a semiconductor laser, and a resonator length thereof is reduced to about several millimeters.

Generally, output stability is enhanced by reducing the resonator length of the solid laser crystal (refer to Non-patent Document 1). Further, the microchip laser is combined with a wavelength conversion element to generate green light (refer to Non-patent Document 2).

Patent Document 1 discloses a semiconductor laser device in which a semiconductor laser array, a solid laser crystal, and a non-linear crystal are combined to perform high-power output of green light.

Further, Patent Document 2 discloses a laser light source which is aimed at increasing the output power by arranging solid laser crystals in a two-dimensional array.

Furthermore, Patent Document 3 proposes a method of making pump light emitted from a semiconductor laser incident on a solid laser crystal without using a lens by disposing the solid laser crystal close to the semiconductor laser, thereby to realize miniaturization of a laser light source.

Moreover, Patent Document 4 proposes a method of miniaturizing a laser light source and constituting an SHG laser of an internal resonator structure by reducing the resonator length according to Nd concentration in a $YVO_4$ crystal.

In addition, Patent Document 5 discloses a method of pumping one laser crystal with plural semiconductor lasers to achieve high output power, and a method of pumping plural laser crystals which are bonded together, with plural semiconductor lasers.

A laser light source disclosed in Patent Document 6 is proposed as one for realizing further miniaturization of a green light source and higher output power. The laser light source disclosed in Patent Document 6 adopts $KTiOPO_4$ (KTP) as a non-linear optical crystal and $YVO_4$ as a laser crystal, and these crystals are bonded together using an adhesive agent.

Patent Document 1: Japanese Published Patent Application No. 2004-111542

Patent Document 2: Japanese Published Patent Application No. Hei.9-246648

Patent Document 3: Japanese Patent No. 2586200

Patent Document 4: Japanese Patent No. 3091329

Patent Document 5: Japanese Patent No. 3053273

Patent Document 6: Japanese Published Patent Application No. 2004-31683

Non-patent Document 1: Journal of Optical Society of America B Vol. 11, pp 436-445, 1994

Non-patent Document 2: Optics Communications 105 (1994) p 183-187

DISCLOSURE OF THE INVENTION

Problems to be Solved by the Invention

However, in the laser light source disclosed in Patent Document 6 having the solid laser crystal and the non-linear optical crystal which are bonded together, since there is a difference in thermal expansion coefficient between the solid laser crystal and the non-linear optical crystal, if the solid laser crystal itself generates heat or the adhesion part absorbs heat during laser oscillation, the bonded laser crystal and non-linear optical crystal are separated from each other, which results in stoppage of laser oscillation. Further, since the KTP of poor efficiency is used as the non-linear optical crystal, an output power of only 50 to 60 mW can be obtained.

The present invention is made to solve the above-described problems and has for its object to provide a high-power laser light source which can perform laser oscillation in a stable transverse mode.

Further, another object of the present invention is to provide a display device using a laser light source which is excellent in stable transverse mode and high-power characteristics.

Measures to Solve the Problems

In order to solve the above-described problems, according to Claim 1 of the present invention, there is provided a laser light source comprising a semiconductor laser for outputting pump light, and a laser resonator constituted such that a solid laser crystal pumped by the pump light emitted from the semiconductor laser and a non-linear optical crystal for converting a wavelength of light emitted from the solid laser crystal are bonded to each other, with a first reflection layer and a second reflection layer provided on the opposed facets of the respective crystals, wherein the solid laser crystal comprises $Gd_xY_{1-x}VO_4$ ($0 \leq x \leq 1$), the non-linear optical crystal comprises $LiNbO_3$ or $LiTaO_3$, a c axis which is a crystal axis of the solid laser crystal is inclined with respect to a z axis of the non-linear optical crystal within a z-x plane of the non-linear optical crystal, a perpendicular line of the c axis which is the crystal axis of the solid laser crystal is approximately parallel to an emission direction of a laser beam from the pump semiconductor laser, and the pump semiconductor laser emits green light of 300 mW which is continuous light.

Further, according to Claim 2 of the present invention, there is provided a laser light source comprising plural semiconductor lasers each outputting pump light, and a laser resonator constituted such that a solid laser crystal having plural pump parts pumped by the pump lights emitted from the plural semiconductor lasers and a non-linear optical crystal for converting wavelengths of plural lights pumped by the pump parts in the solid laser crystal are bonded to each other, with a first reflection layer and a second reflection layer provided on the opposed facets of the respective crystals, wherein the solid laser crystal comprises $Gd_xY_{1-x}VO_4$ ($0 \leq x \leq 1$), the non-linear optical crystal comprises $LiNbO_3$ or $LiTaO_3$, a c axis which is a crystal axis of the solid laser crystal is inclined with respect to a z axis of the non-linear optical crystal within a z-x plane of the non-linear optical crystal, a perpendicular line of the c axis which is the crystal axis of the solid laser crystal is approximately parallel to an emission direction of a laser beam from each pump semiconductor laser, and each pump semiconductor laser emits green light of 300 mW which is continuous light.

Further, according to Claim 3 of the present invention, in the laser light source defined in Claim 1 or 2, the inclination of the c axis which is the crystal axis of the solid laser crystal is within a range from 0.5° to 10°.

Further, according to Claim 4 of the present invention, in the laser light source defined in Claim 1 or 2, the total of the thicknesses of the solid laser crystal and the non-linear optical crystal is 2 mm or less, and the length of the laser resonator is 2 mm or less.

Further, according to Claim 5 of the present invention, in the laser light source defined in Claim 2, the plural pump parts in the solid laser crystal are separated from each other by 200 μm or more.

Further, according to Claim 6 of the present invention, in the laser light source defined in Claim 2, the intervals between the plural pump parts in the solid laser crystal are different from each other.

Further, according to Claim 7 of the present invention, the laser light source defined in Claim 2 further includes a heatsink having a surface on which steps are formed, and at least two semiconductor lasers among the plural semiconductor lasers are disposed on the steps of the heatsink which have different heights.

Further, according to Claim 8 of the present invention, in the laser light source defined in Claim 1 or 2, the width of an active layer of the semiconductor laser is 50 μm or less.

Further, according to Claim 9 of the present invention, in the laser light source defined in Claim 1, the semiconductor laser and the solid laser crystal of the laser resonator are provided with heatsinks, respectively, and a heat separation layer is provided between the heatsink to which the semiconductor laser is fixed and the heatsink provided on the solid laser crystal of the laser resonator.

Further, according to Claim 10 of the present invention, in the laser light source defined in Claim 2, the plural semiconductor lasers and the solid laser crystal of the laser resonator are provided with heatsinks, respectively, and a heat separation layer is provided between the heatsink to which the semiconductor lasers are fixed and the heatsink provided on the solid laser crystal of the laser resonator.

Further, according to Claim 11 of the present invention, the laser light source defined in Claim 1 or 2 further includes a volume grating on a rear facet of the semiconductor laser.

Further, according to Claim 12 of the present invention, in the laser light source defined in Claim 2, the laser resonator has heatsink parts between the plural pump parts.

Further, according to Claim 13 of the present invention, in the laser light source defined in Claim 1 or 2, the solid laser crystal and the non-linear optical crystal are optically contacted to each other.

Further, according to Claim 15 of the present invention, in the laser light source defined in Claim 1 or 2, the solid laser crystal comprises $Nd:YVO_4$ having a Nd doping amount of 2.5 at % or more and a crystal thickness of 0.5 mm or less.

Further, according to Claim 16 of the present invention, in the laser light source defined in Claim 1 or 2, the solid laser crystal comprises $Nd:GdVO_4$ having a Nd doping amount of 2.5 at % or more and a crystal thickness of 0.5 mm or less.

Further, according to Claim 17 of the present invention, in the laser light source defined in Claim 1 or 2, the non-linear optical crystal comprises $LiNbO_3$ including any of Mg, Zn, In, and Sc and having a periodical polarization inversion structure, and has a thickness of 1 mm or less.

Further, according to Claim 18 of the present invention, in the laser light source defined in Claim 1 or 2, any opposed side surfaces of the solid laser crystal are nonparallel.

Further, according to Claim 19 of the present invention, the laser light source defined in Claim 2 further includes grooves between the pump parts in the solid laser crystal.

Further, according to Claim 20 of the present invention, in the laser light source defined in Claim 19, the grooves and the facets of the solid laser crystal are nonparallel.

Further, according to Claim 21 of the present invention, in the laser light source defined in Claim 17, the period of the polarization inversion structure formed on the non-linear optical crystal has a distribution within the plane.

Further, according to Claim 22 of the present invention, there is provided a display device comprising at least two laser light sources among the laser light sources defined in Claims 1 to 21, a uniformization optical system for shaping laser beams emitted from the plural laser light sources, a collimator optical system for collimating the plural laser beams shaped by the uniformization optical system, and a two-dimensional image conversion device for converting the plural laser beam collimated by the collimator optical system into a two-dimensional image.

Further, according to Claim 23 of the present invention, in the display device defined in Claim 22, the uniformization optical system is constituted by a rod prism.

Further, according to Claim 24 of the present invention, the display device defined in Claim 22 further includes an optical element for modulating at least one of deflection, phase, and polarization of the laser light incident on the rod prism.

Further, according to Claim 25 of the present invention, the laser light source defined in Claim 1 or 2 outputs green light of 200 mW or more.

Effects of the Invention

According to the present invention, there is provided a laser light source comprising a semiconductor laser for outputting pump light, and a laser resonator constituted such that a solid laser crystal pumped by the pump light emitted from the semiconductor laser and a non-linear optical crystal for converting a wavelength of light emitted from the solid laser crystal are bonded to each other, with a first reflection layer and a second reflection layer provided on the opposed facets of the respective crystals, wherein the solid laser crystal comprises $Gd_xY_{1-x}VO_4$ ($0 \leq x \leq 1$) while the non-linear optical crystal comprises $LiNbO_3$ or $LiTaO_3$, a c axis which is a crystal axis of the solid laser crystal is inclined with respect to the z axis of the non-linear optical crystal within the z-x plane of the non-linear optical crystal, a perpendicular line of the c axis which is the crystal axis of the solid laser crystal is approximately parallel to an emission direction of a laser beam from the pump semiconductor laser, and the pump semiconductor laser emits green light of 300 mW which is continuous light. Since the thermal expansion coefficient of the solid laser crystal and the thermal expansion coefficient of the non-linear optical crystal can be approximated to each other, it is possible to avoid the problem that the bonded laser crystal and non-linear optical crystal are separated from each other due to a difference in thermal expansion coefficient between the solid laser crystal and the non-linear optical crystal when a heat is generated during laser oscillation, which results in stoppage of laser oscillation. Further, an increase in output power of green light can be performed with stability, resulting in a more stable and highly reliable light source.

According to the present invention, there is provided a display device comprising at least two laser light sources among the laser light sources defined in Claims 1 to 21, a uniformization optical system for shaping laser beams emitted from the plural laser light sources, a collimator optical system for collimating the plural laser beams shaped by the uniformization optical system, and a two-dimensional image conversion device for converting the plural laser beam collimated by the collimator optical system into a two-dimensional image, wherein the in-plane distributions of the plural laser beams emitted from the plural laser light sources are uniformized by the uniformization optical system, and the laser beams are converted into an image by the two-dimensional image conversion device. Therefore, reduction in speckle noise as well as stabilization of the output power can be achieved, thereby realizing high-definition display.

BRIEF DESCRIPTION OF THE DRAWINGS

FIG. 1(a) is a top plan view illustrating an example of a laser light source according to a first embodiment of the present invention, and FIG. 1(b) is a front view illustrating an example of a display device using the laser light source.

FIG. 5 is a diagram illustrating a characteristic factor of the laser light source according to the second embodiment, wherein

FIG. 6(a) is a top plan view illustrating another example of the laser light source according to the second embodiment, FIG. 6(b) is a front view thereof, and FIG. 6(c) is a right side view thereof.

DESCRIPTION OF REFERENCE NUMERALS

Figure 2B:
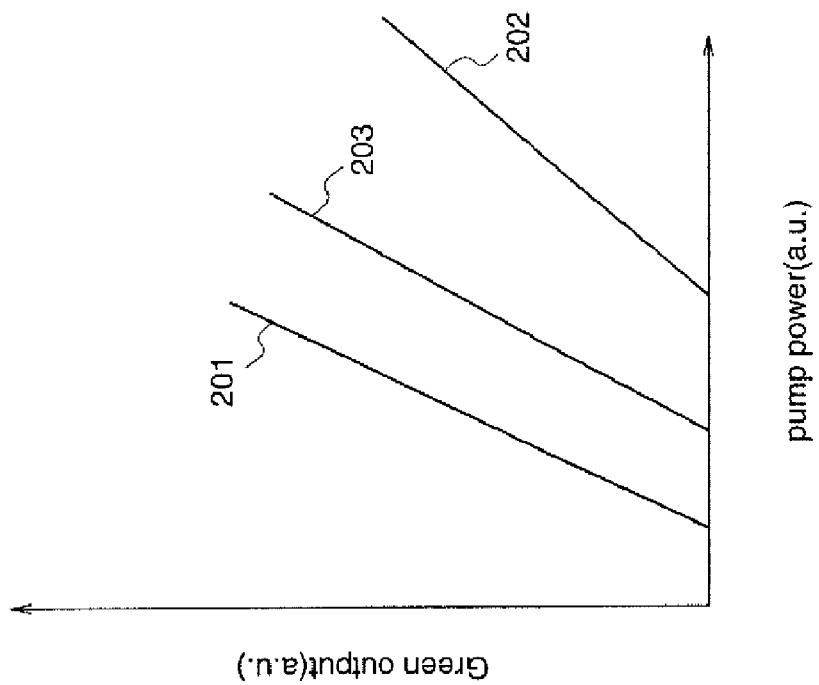
FIG. 2(a) is a plot diagram illustrating the relationship between the angles of reference directions and the magnitudes of thermal expansion coefficients in the laser light source of the first embodiment.
FIG. 2(h) is a plot diagram illustrating the relationship between the inclinations of the reference directions and the oscillation threshold/oscillation characteristics.

101 . . . heatsink
102 . . . semiconductor laser
103 . . . non-linear material (non-linear optical crystal)
104 . . . solid laser crystal
105 . . . reflection coat (second reflection layer)
106 . . . reflection coat (first reflection layer)
107 . . . laser light
108 . . . laser light source device
109 . . . optical element
110 . . . rod prism
111 . . . SLM
112 . . . projection lens
201 . . . oscillation characteristics when inclination angle is 0°
202 . . . oscillation characteristics when inclination angle is 30°
203 . . . oscillation characteristics when inclination angle is 90°
601 . . . pump part
701,801 . . . heatsinks
1001 . . . volume grating
121 . . . semiconductor laser
122 . . . semiconductor laser
123 . . . pump part
131,132,133,134 . . . side surfaces
135 . . . pump part
136 . . . laser oscillation
137 . . . groove
141 . . . heat separation layer

BEST MODE TO EXECUTE THE INVENTION

Hereinafter, embodiments of the present invention will be described in detail with reference to the drawings.

Embodiment 1

Hereinafter, a laser light source according to a first embodiment of the present invention will be described.

FIG. 1(a) is a top plan view illustrating the construction of the laser light source according to the first embodiment.

The laser light source 108 according to the first embodiment includes a semiconductor laser chip 102, and a laser resonator which is constituted such that a solid laser crystal 104 and a non-linear material 103 are bonded together and reflection coats 106 and 105 are formed on the opposed facets of these crystals.

The semiconductor laser chip 102 emits pump light. This semiconductor laser chip 102 is fixed to a heatsink 101 with a solder paste.

The solid laser crystal 104 has a pump part 601 to be pumped by the pump light from the semiconductor laser chip 102. $Gd_xV_{1-x}O_4$ ($0 \leq x \leq 1$) is used as the solid laser crystal 104.

The non-linear material 103 converts the wavelength of light that is pumped by the pump part 601 in the solid laser crystal 104. Lithium niobate ($LiNbO_3$) or lithium tantalate ($LiTaO_3$) is used as the non-linear optical crystal 103.

The operation of the laser light source according to the first embodiment will be described.

The laser light (having an oscillation wavelength around 808 nm) emitted from the semiconductor laser 102 pumps the pump part 601 in the solid laser crystal 104, and generates light having a wavelength of about 1.06 µm. The generated light is wavelength-converted into a higher harmonic wave by the non-linear material 103, and thereby green laser light 107 having a wavelength of 0.53 µm is generated and outputted to the outside.

Hereinafter, the characteristics of the laser light source according to the first embodiment will be described.

In this first embodiment, neodymium-doped yttrium orthovanadate ($Nd:YVO_4$) crystal is used as the solid laser crystal 104, and the thermal expansion coefficients of this crystal along the crystal axes in the a axis direction and the c axis direction are $\alpha a = 4.43 \times 10^{-6}/K$ and $\alpha c = 11.37 \times 10^{-6}/K$, respectively. Further, magnesium-oxide-doped lithium niobate ($Mg:LiNbO_3$) is used as the non-linear material 103, and the thermal expansion coefficients of this material along the crystal axes in the a axis direction and the c axis direction are $\alpha a = 2.0 \times 10^{-6}/K$ and $\alpha c = 2.2 \times 10^{-6}/K$, respectively.

Usually, when the solid laser crystal and the non-linear material are bonded together by optical contact, diffusion bonding, adhesive agent, or the like, this bonding is performed such that that the c axis of the $Nd:YVO_4$ is matched to the c axis of the $Mg:LiNbO_3$ to match the polarization direction of the light emitted from the solid laser crystal to the polarization direction of the light to be incident on the wavelength conversion crystal. However, since the difference in thermal expansion coefficient in the c axis direction between the $YVO_4$ crystal and the $LiNbO_3$ crystal is more five times or more, cracks might enter the $YVO_4$ crystal when the $YVO_4$ crystal generates heat during laser oscillation and the temperature reaches about 100° C. So, in the present invention, the c axis of the solid laser crystal is inclined with respect to the z axis of the non-linear optical crystal within the z-x plane of the non-linear optical crystal, whereby the thermal expansion coefficient at the surface bonded to the $Mg:LiNbO_3$ crystal can be reduced apparently. Thereby, occurrence of cracks during laser operation can be avoided, and the reliability of the laser device can be enhanced.

Figure 3:
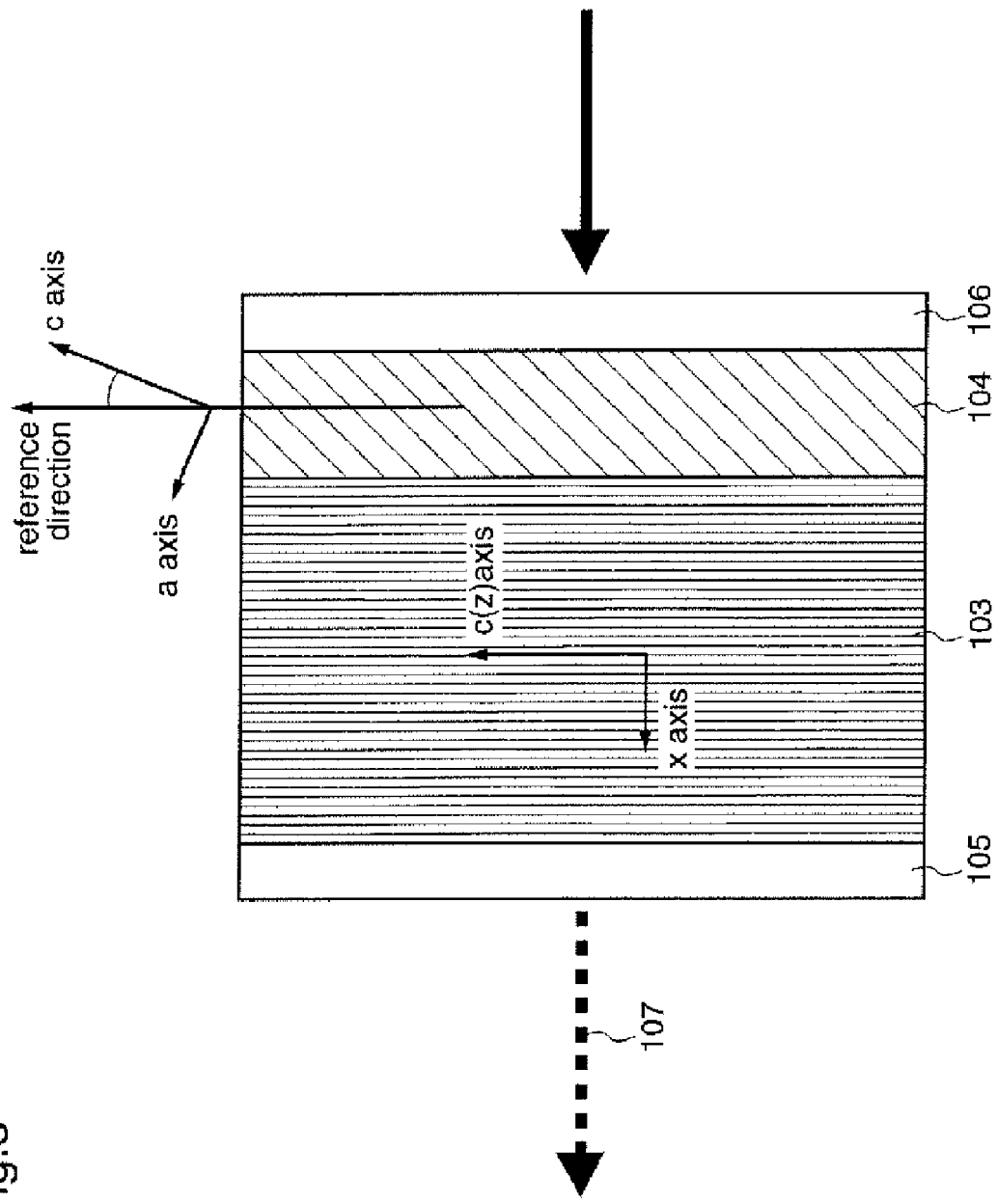
FIG. 3 is a schematic diagram illustrating the relationship between a crystal axis direction of a solid laser crystal and a crystal axis of a non-linear optical crystal (MgO:LiNbO$_3$) according to the first embodiment.

FIG. 3 shows the relationship between the angles of the crystal axes of the non-linear optical material and the solid laser crystal in the laser light source according to the first embodiment. As shown in FIG. 3, the c axis of the non-linear material 103 is equal to the z axis thereof. The c axis of the solid laser crystal 104 is inclined with respect to the z axis of the non-linear material 103 within the z-x plane of the non-linear material 103.

Hereinafter, the relationship between the incident direction of the pump light and the inclination of the $Nd:YVO_4$ crystal will be described with reference to FIG. 2(a).

Figure 2A:
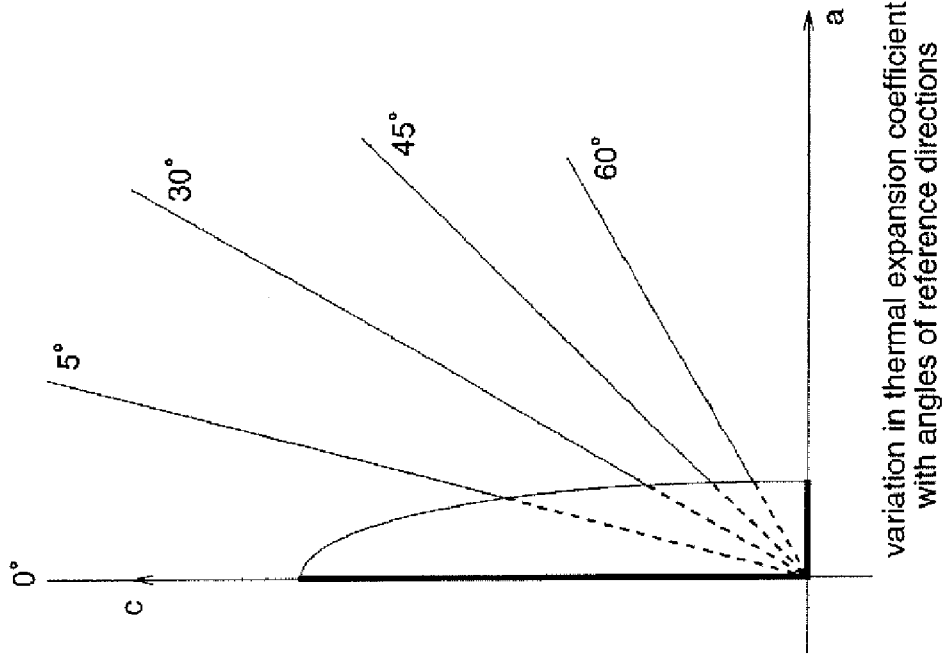

When the optical axis (c axis) of the $Nd:YVO_4$ crystal with respect to a reference direction (a direction parallel to the z axis of the non-linear material 103) is moved from the c axis to the a axis within the z-x plane of the non-linear material 103, i.e., when the inclination angle of the optical axis of the $Nd:YVO_4$ crystal is changed from 0° to 90°, the thermal expansion coefficient of the $YVO_4$ gradually decreases while drawing a ellipsoidal curve as shown in FIG. 2(a). However, since the absorption coefficient of the pump light decreases as the inclination angle approaches 90°, the oscillation threshold of the pump light power increases, leading to a problem that the efficiency is reduced or the polarization direction of the oscillated light parallel to the c axis direction becomes random. On the other hand, when the inclination angle is 5° or less, the difference in the thermal expansion coefficient between the $YVO_4$ crystal and the $LiNbO_3$ crystal cannot be reduced.

Accordingly, the angle formed between the fundamental direction and the c axis direction of the solid laser crystal 104 is desirably within a range of 5° to 60°. In this case, since the thermal expansion coefficient of the solid laser crystal can be approximated to the thermal expansion coefficient of the non-linear optical crystal, the bonded solid laser crystal and non-linear optical crystal are prevented from being separated due to the heat generated during laser oscillation, thereby realizing a laser light source having an output power of 200 mW or more. More preferably, the angle should be within a range of 5° to 45° because linear polarization can be easily obtained.

FIG. 2(b) shows the relationship between the inclination angles in the $Nd:YVO_4$ crystal (0° (c axis), 30°, 90° (a axis)) and the oscillation threshold. As seen from FIG. 2(b), when the inclination angle is varied like 0°, 30°, 90°, the oscillation threshold also varies as shown by 201, 202, and 203, respectively.

As described above, by setting the angle formed between the reference direction and the c axis direction of the solid laser crystal 104 within a predetermined range, the reliability is enhanced, and moreover, oscillation with linear polarization can be performed without significantly deteriorating the oscillation threshold. Thereby, it is possible to realize a laser light source having, as a green light output, a high power of 200 mW or more and especially 300 mW or more.

While in this first embodiment the $Nd:YVO_4$ crystal is used as the solid laser crystal 104, $Nd:GdVO_4$ crystal may be used. When using the $Nd:GdVO_4$ crystal, since the thermal expansion coefficients of the crystal axes in the a axis direction and the c axis direction are $\alpha a = 1.5 \times 10^{-6}/K$ and $\alpha c = 7.3 \times 10^{-6}/K$, respectively, the thermal expansion coefficient of the solid laser crystal can be further approximated to that of the non-linear optical crystal $Mg:LiNbO_y$ and thereby the inclination angle between the reference direction and the c axis direction of the solid laser crystal 104 can be further reduced. In this case, the inclination angle of the solid laser crystal 104 is desirably within a range of 5° to 45°. More preferably, it should be within a range of 5° to 30°.

As described above, the laser light source according to the first embodiment is provided with the semiconductor laser that outputs pump light, and the laser resonator which is constituted such that the solid laser crystal 104 having the pump part 601 to be pumped by the pump light from the semiconductor laser chip 102 and the non-linear optical crystal 103 for converting the wavelength of the light pumped by the pump part 601 in the solid laser crystal are combined by optical contact, and the reflection coats 106 and 105 are formed on the opposed facets of the respective crystals, and $Gd_xV_{1-x}O_4$ ($0 \leq x \leq 1$) is used as the solid laser crystal 104 while $LiNbO_3$ or $LiTaO_3$ is used as the non-linear optical crystal 103, and the crystal axis of the solid laser crystal 104 is inclined with respect to the z axis of the non-linear optical crystal within the z-x plane of the non-linear optical crystal 103. Therefore, the thermal expansion coefficient of the solid laser crystal and the thermal expansion coefficient of the non-linear optical crystal can be approximated to each other. Accordingly, the bonded laser crystal and non-linear optical crystal are prevented from being separated due to heat generated during laser oscillation, and thereby the stable output of the beam can be maintained, resulting in a more-stable and highly-reliable laser light source.

Embodiment 2

Hereinafter, a laser light source device according to a second embodiment of the present invention will be described.

While in the first embodiment one solid laser crystal is pumped by one semiconductor laser light source, in this second embodiment a solid laser crystal is pumped at plural positions by using plural semiconductor laser light sources.

Figure 4A:
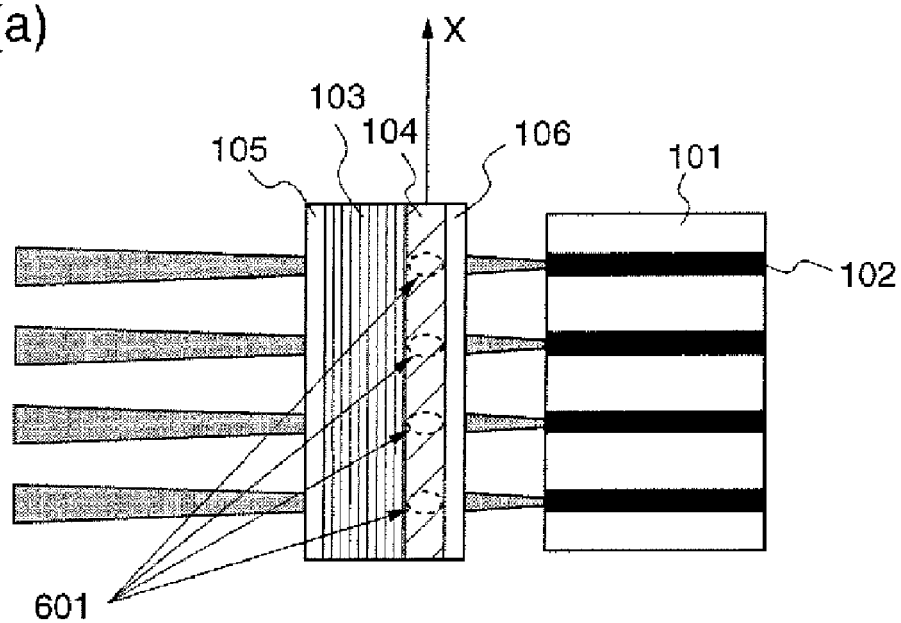
FIG. 4(a) is a top plan view illustrating the construction of a laser light source according to a second embodiment of the present invention.
Figure 4B:
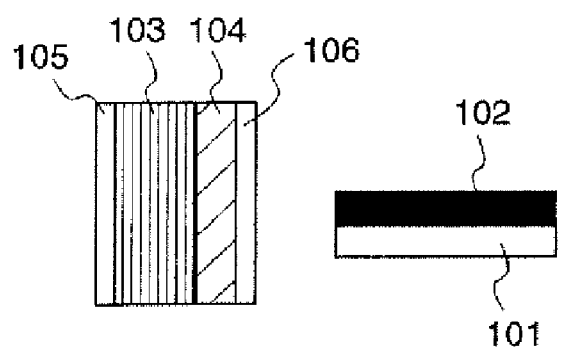
FIG. 4(b) is a front view of the laser light source.

FIG. 4(a) is a top plan view illustrating the construction of a laser light source according to the second embodiment, and FIG. 4(b) is a front view thereof.

The laser light source of the second embodiment includes plural semiconductor laser chips 102, and a laser resonator which is constituted such that a solid laser crystal 104 and a non-linear material 103 are bonded together and reflection coats 106 and 105 are formed on the opposed facets of the respective crystals.

The plural semiconductor laser chips 102 emit pump lights, respectively. The plural semiconductor laser chips 102 are fixed to a heatsink 101 with a solder paste.

The solid laser crystal 104 has plural pump parts 601 to be pumped by the pump lights emitted from the plural semiconductor laser chips 102.

The non-linear material 103 converts the wavelengths of the plural lights that are pumped by the plural pump parts 601 in the solid laser crystal 104.

The operation of the laser light source according to the second embodiment will be described.

The plural laser lights (each having an oscillation wavelength around 808 nm) emitted from the plural semiconductor lasers 102 pump the plural pump parts 601 in the solid laser crystal 104, and thereby plural lights each having a wavelength around 1.06 μm are generated. Thus generated plural lights are wavelength-converted into higher harmonics by the non-linear material 103, thereby generating green laser light 107 having a wavelength of 0.53 μm.

Hereinafter, the characteristics of the laser light source according to the second embodiment will be described.

Since the laser resonator is constituted by the solid laser crystal and the non-linear optical material, the structure thereof can be simplified. Further, the number of beam spots is increased to increase the output power.

In order to oscillate such solid laser crystal with stability, it is necessary to stabilize the laser oscillation in the laser resonator, and it is important to stabilize the longitudinal mode and transverse mode of laser oscillation.

First of all, stabilization of the longitudinal mode will be described.

Figure 5B:
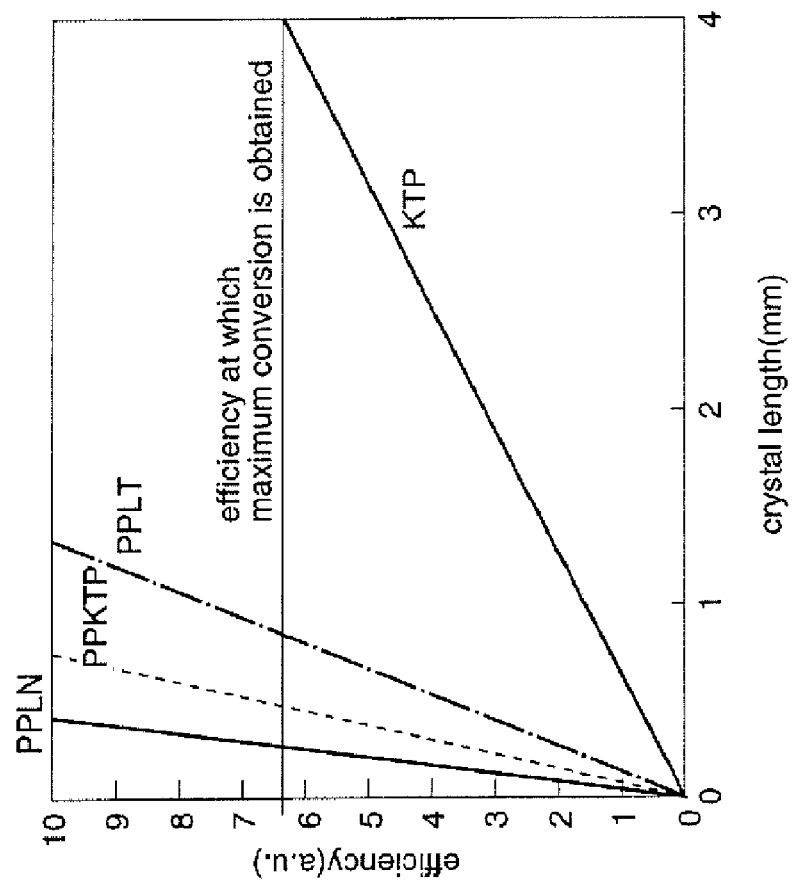
FIG. 5(b) is a diagram illustrating the relationship between crystal lengths of various non-linear materials and efficiencies.
Figure 5A:
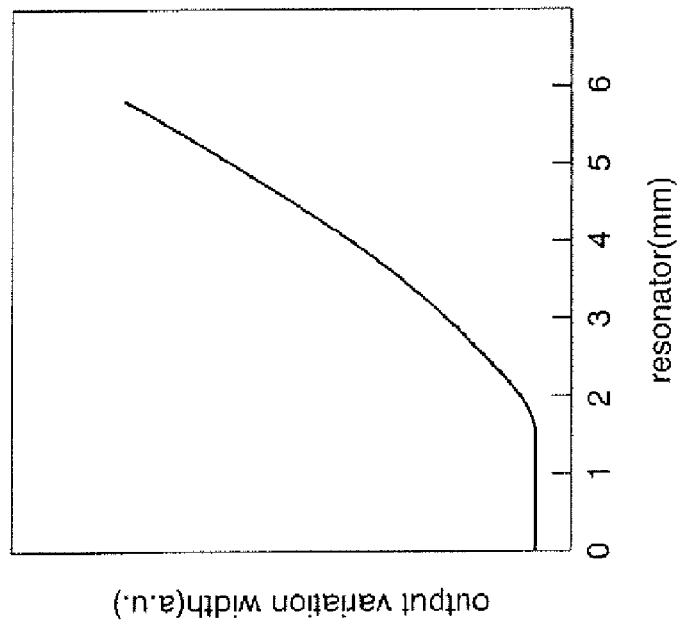
FIG. 5(a) is a diagram illustrating the relationship between a resonator length and a fluctuation of laser output power.

The longitudinal mode is the largeness of the number of oscillation spectrums in the laser resonator, and becomes unstable when it becomes multimode and thereby the oscillation spectrums increase. The microchip laser can suppress the oscillation mode by reducing the resonator length to stabilize the output power. Actually, it is possible to suppress occurrence of multimode by reducing the optical length of the laser resonator to 4 mm or less. FIG. 5(a) shows the result of experiment for stability of the output power with the resonator length being varied. As can be seen from FIG. 5(a), assuming that the refractive index of the medium is about 2, when the laser resonator length exceeds 2 mm, the output fluctuation width increases relative to that obtained when the optical length is 4 mm.

On the other hand, the solid laser crystal and the non-linear optical crystal are required to constitute the laser resonator, and the length of the resonator comprising the lengths of these crystals must be reduced to 2 mm or less. However, since the length of the non-linear crystal is proportional to the conversion efficiency, the conversion efficiency is degraded if the element is shortened. FIG. 5(b) shows the relationships between the conversion efficiencies of highly-efficient non-linear materials and the element lengths. Assuming that the output power of the pumped solid laser crystal is about 1 W, in order to obtain a maximum conversion efficiency, a conversion efficiency as high as a value with which the maximum conversion efficiency shown in FIG. 5(b) can be obtained is required. As for the crystal lengths of the non-linear materials in this case, 4 mm is required for KTP, 0.8 mm for $LiTaO_3$ (PPLT) having a periodic polarization inversion structure, 0.5 mm for KTP(PPKTP) having a periodic polarization inversion structure, and 0.25 mm for $LiNbO_3$(PPLN) having a periodic polarization inversion structure.

By the way, the thickness of the solid laser crystal can be reduced to 0.5 mm or less when the Nd doping amount is 2.5 at % or more. When KTP is used as the non-linear material to reduce the resonator length to 2 mm or less, the maximum efficiency cannot be obtained. Stable output characteristics are obtained only when the crystal having the periodic polarization inversion structure such as PPLT, PPKTP, or PPLN is used. Since particularly PPLN has a very high conversion efficiency, it is superior in stability and high efficiency characteristics as well as the resonator length can be reduced. However, PPLN has a problem of optical damage, which makes it difficult to obtain high-power green light with stability. In order to solve this problem, Mg-doped $LiNbO_3$ is used in this embodiment. Thereby, the problem of optical damage is resolved, and a resonator length of 1 mm or less is realized even when it is combined with the solid laser crystal. Therefore, the stability of the output power is significantly increased, and a stable operation can be obtained against external temperature change.

Further, since the laser resonator has a planar structure, the loss in the resonator is greatly influenced by the resonator length. Therefore, when the resonator length is reduced to 2 mm or less, the loss in the resonator can be reduced, thereby increasing the efficiency.

Further, a crystal having a periodic polarization inversion structure is adopted as the non-linear material. The phase match wavelength of the non-linear optical crystal is determined by the polarization inversion period. In the construction where the plural pump parts in the solid laser crystal are simultaneously pumped, temperature rise occurs in the solid laser crystal. This temperature rise occurs in each pump part, and a temperature distribution occurs in each pump part. To be specific, the pump part positioned near the center of the crystal has a higher temperature than those positioned near the edges of the crystal. Since this temperature is propagated to the non-linear optical crystal, the phase match condition of the non-linear optical crystal partially varies, and thereby the total conversion efficiency is degraded. In order to solve this problem, the period of the polarization inversion part is desirably designed so as to have partial distributions. Since the center portion of the crystal will be increased in temperature, the polarization inversion period in the center portion should be set shorter than that in the peripheral portion.

Next, stability of the transverse mode will be described.

Figure 4C:
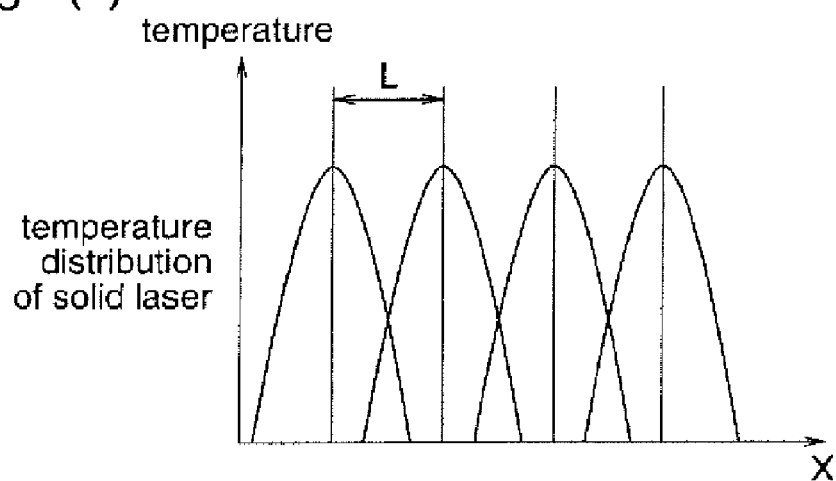
FIG. 4(c) is a diagram illustrating a temperature distribution in a solid laser crystal.

When the solid laser crystal is pumped with the plural pumping light sources as shown in FIG. 4, stability of the transverse mode is important for output stability. In the transverse mode, the pump parts are separated from each other so that the laser oscillations in the solid laser crystal are independent from each other and do not interfere with each other. Since the microchip laser uses the resonator formed between the plain plates, stabilization of the resonator as well as reduction in loss are achieved utilizing the thermal lens effect of the pumped parts in the solid laser crystal. Therefore, if the pump parts in the solid laser crystal optically and thermally interfere with each other, the oscillation becomes unstable. Further, since the light beam spots in the resonator are expanded, the conversion efficiency in the non-linear optical crystal is degraded. Therefore, it is necessary to sufficiently reduce the interference in the transverse direction in the resonator. FIG. 4(c) shows the temperature distributions in the transverse direction in the solid laser crystal. When the temperature distributions are separated in the transverse direction, generation of thermal lenses can be stabilized. According to our inspection, when the width of the active layer of the pump semiconductor laser is about 50 μm, stable oscillation is confirmed with the interval of the pump parts being 200 μm or more. When the width of the active layer is 100 μm, an interval of 250 μm or more is required. The width of the active layer of the semiconductor laser is preferably 100 μm or less, and more preferably, it should be 50 μm or less. The width of the active layer determines the size of the pump part in the solid laser crystal, and determines the size of the transverse mode that is oscillated in the solid laser crystal. When the transverse mode is large, the power density in the resonator is decreased and thereby the efficiency of wavelength conversion is significantly degraded. Therefore, the width of the active layer is desired to be 50 μm.

For the above-mentioned reasons, a laser light source as follows is fabricated according to the second embodiment.

Three semiconductor lasers 102 each having an output power of 1 W and an active layer having a width of 50 μm are fixed on a heatsink 101 at intervals of 200 μm. A solid laser crystal 104 comprises Nd:YVO$_4$ and has a crystal length of 0.5 mm, and a non-linear crystal 103 comprises Mg-doped LiNbO$_3$ having a periodical polarization inversion structure and has a crystal length of 0.5 mm.

In the laser light source thus fabricated, since the output power of green light from each beam is 0.3 W, green light of 0.9 W in total can be generated. The output power is stable, and instability due to fluctuation in the mode or the like is not observed. Since the conventional laser light source using KTP has the one beam structure and the output power of about 0.1 W, it is confirmed that the laser light source of the present invention provides significant increase in the output power and stability.

In the case of the conventional array type semiconductor laser, the solid laser crystals pumped at the respective active layers interfere with each other, and thereby the laser oscillation becomes unstable. Further, while the conventional laser has the problem that mode expansion of the solid laser crystal occurs and the efficiency of the wavelength conversion is reduced, this problem is solved by the construction of the second embodiment.

Even when LiNbO$_3$ to which In, Zn, Sc or the like is doped is used instead of Mg-doped LiNbO$_3$, resistance to optical damage is increased, and high-power output can be achieved.

Further, Nd:YVO$_4$ or Nd:GdVO$_4$ is preferable as the solid laser crystal. Since the doping amount of Nd can be increased, the absorption coefficient of the pump light can be increased, whereby the construction of the microchip laser is simplified. The advantage of Nd:YVO$_4$ or Nd:GdVO$_4$ is that it performs laser oscillation with single polarization because the pumping efficiency of the solid laser crystal has an anisotropy to the crystal axis. Since the wavelength conversion of the non-linear optical material has polarization dependency, the oscillation with single polarization significantly increases the conversion efficiency. Particularly since the light axis of birefringence matches the light axis of phase matching particularly in the non-linear optical crystal having the periodic polarization inversion structure, variation in the polarization due to temperature is small, and the conversion efficiency can be enhanced when it is combined with the single-polarization solid laser crystal, thereby realizing stabilized polarization. Further, Nd:YVO$_4$ and Nd:GdVO$_4$ have extraordinary refractive indexes of 2.165 and 2.15, respectively, which are approximately equal to the refractive index 2.15 of the Mg-doped LiNbO$_3$. Therefore, the difference in the refractive index which is obtained when these crystals are optically or directly connected is very small and the Fresnel loss is significantly reduced, whereby the loss in the resonator is reduced to achieve high efficiency.

Nd:GdVO4 is more preferable to Nd:YVO$_4$ as the solid laser crystal. Since the thermal expansion coefficient of Nd:GdVO$_4$ crystal is closer to that of Mg-doped LiNbO$_3$, when the non-linear optical crystal Mg-doped LiNbO$_3$ and the solid laser crystal Nd:GdVO$_4$ are joined, distortion that occurs at the junction part due to temperature variations in the crystals is small. Therefore, the junction process is facilitated, and stable junction can be obtained against external temperature variations.

FIG. 6 illustrates another example of the construction of the laser light source according to the second embodiment, wherein FIG. 6(a) is a top plan view thereof, FIG. 6(b) is a front view thereof, and FIG. 6(c) is a right side view thereof.

As shown in FIG. 6(c), a heatsink 101 has step differences at its surface, and a plurality of semiconductor laser chips 102 are disposed on the steps of different heights.

By forming the step differences at the surface of the heatsink 101, thermal influence between the semiconductor lasers is reduced, and the oscillations of the respective semiconductor lasers are stabilized. Further, since the surface area is increased, the lifetimes of the semiconductor lasers are extended due to the cooling effect. Furthermore, since the distance between the light emitting points in the solid laser crystal can be increased with the same size of the solid laser crystal by stereoscopically arranging the solid laser crystal, it is effective for miniaturization.

FIG. 13 shows the shapes of solid laser crystals.

Figure 13A:
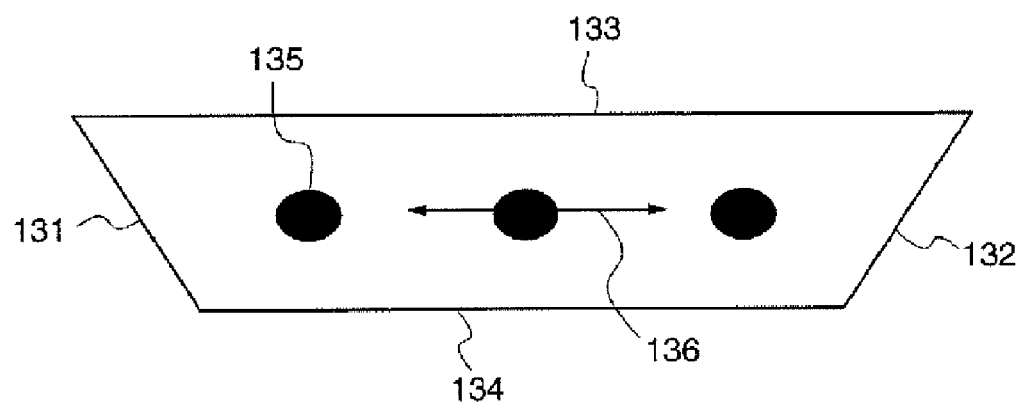
FIGS. 13(a) and 13(b) are diagrams illustrating an example of a solid laser crystal constituting the laser light source according to the first embodiment.

A solid laser crystal shown in FIG. 13(a) has a side surface 131 and a side surface 132 which are not parallel to each other, and a side surface 133 and a side surface 134 which are parallel to each other. Further, three pump parts 135 are provided approximately in the center of the solid laser crystal.

When the laser medium is pumped by the pump lights emitted from the semiconductor lasers, laser oscillation is pumped in the direction perpendicular to the pump parts 135, and thereby resonation occurs between the mirrors (reflection coats) formed on the laser resonator. However, when the intensity of the pump light increases, abnormal laser oscillation 136 occurs between the side surface 131 and the side surface 132 of the solid laser crystal. Since such abnormal laser oscillation causes a loss, the laser oscillation efficiency is significantly reduced. In this second embodiment, since the solid laser crystal is pumped at the plural points, the abnormal laser oscillation 136 is likely to be induced. In order to avoid this, the solid laser crystal is designed so that the side surface 131 and the side surface 132 are nonparallel. Thereby, the abnormal laser oscillation 136 is suppressed and stable oscillation is achieved. Further, it is also effective to make the side surfaces sandy for reducing the reflectivities at the surfaces.

Figure 13B:
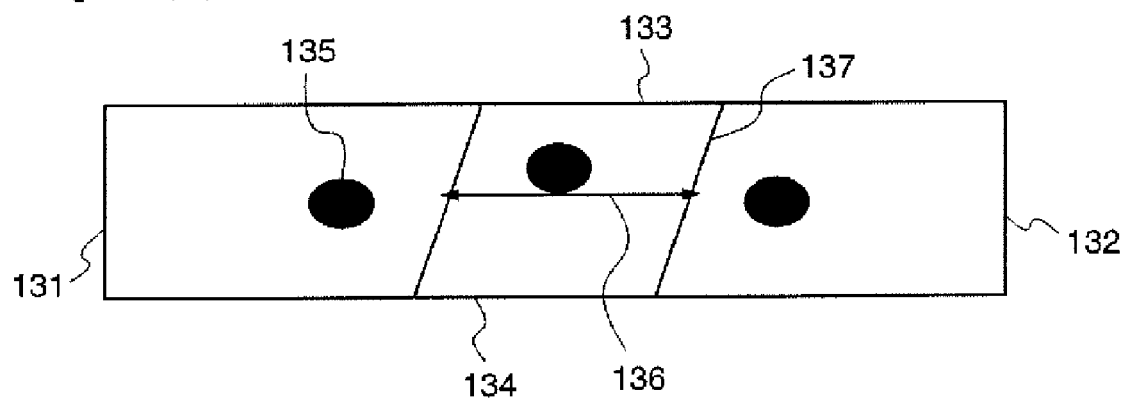

In a solid laser crystal shown in FIG. 13(b), a side surface 131 and a side surface 132 are parallel to each other and a side surface 133 and a side surface 134 are also parallel to each other, and three pump parts 135 are individually laser oscillated.

A method for laser-oscillating the pump parts 135 individually is to design the solid laser crystal so that the respective pump parts 135 are arranged alternately in different levels. Thereby, it is possible to avoid the abnormal laser oscillation 136 caused by the mutual influence between the adjacent pump parts.

Another method is to form grooves (spaces) 137 between the pump parts. Here, two grooves 137 are formed nonparallel to the side surfaces 131 and 132, thereby enhancing the effect. Since the pump parts are separated by the grooves 137, abnormal laser oscillation within the plane can be avoided, thereby obtaining an efficient output power with stability. Further, insertion of such grooves in the solid laser crystal is also effective for reducing a difference in the thermal expansions when the non-linear optical crystal and the laser crystal are bonded together. Since there is a difference of about two times in the thermal expansion coefficient between the Mg-doped LiNbO3 used as the non-linear optical crystal and the solid laser crystal, if the temperature rises due to laser pumping or the like after the crystals are bonded together, disconnection or distortion might occur due to the difference in the thermal expansion coefficients. In contrast, since the grooves formed in the solid laser crystal can absorb the distortion caused by the difference in the thermal expansion coefficients, a resonator resistant to temperature variation can be realized. Further, conduction of heat between the pump parts can be avoided.

Figure 7A:
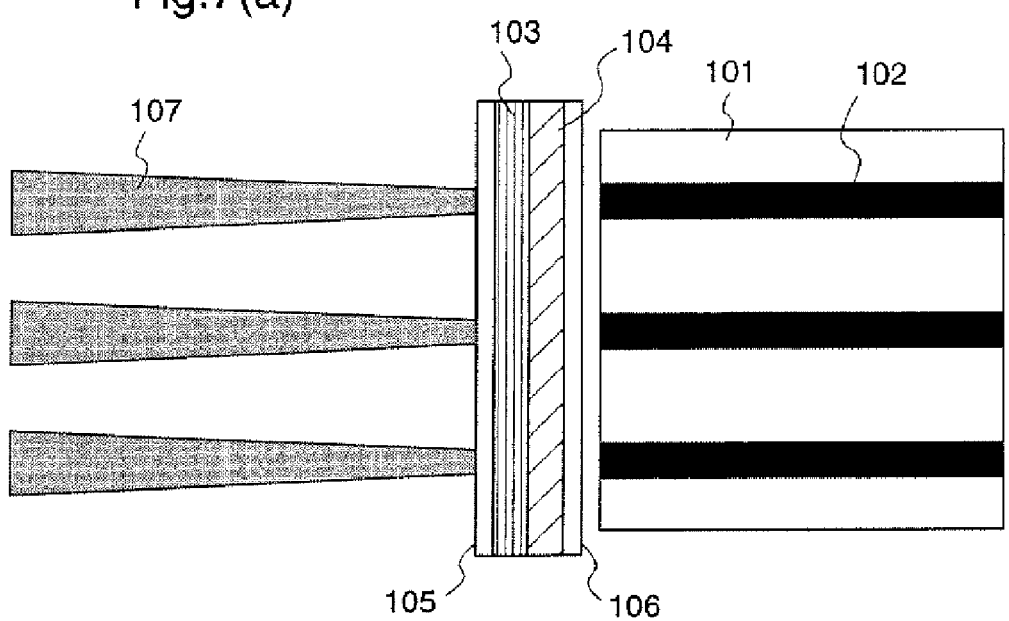
FIG. 7(a) is a top plan view illustrating another example of the laser light source according to the second embodiment.
Figure 7B:
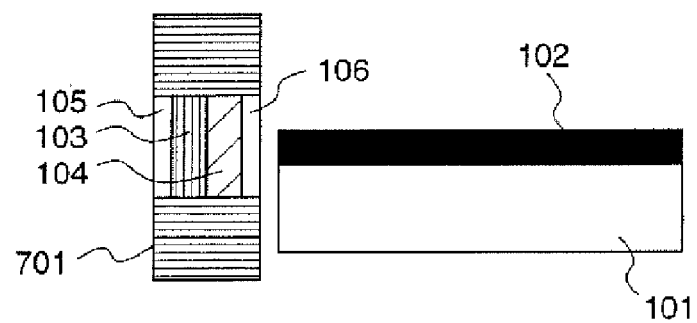
FIG. 7(b) is a front view thereof.

FIG. 7 is a diagram illustrating another example of the construction of the laser light source according to the second embodiment, wherein FIG. 7(a) is a top plan view thereof, and FIG. 7(b) is a front view thereof.

The laser light source shown in FIG. 7 has a heatsink 701 attached to the solid laser crystal 104, thereby to stabilize the output power.

The solid laser crystal 104 absorbs the light emitted from each pumping semiconductor laser 2 and converts it into light having a wavelength of 1.06 μm, but the conversion efficiency is about 50%, and half of the pumped light turns to heat. Although the resonator comprising the solid laser crystal is stabilized by the thermal lens effect due to this heat, it is necessary to provide spaces between the pump parts 601 to suppress the influence between the adjacent pump parts. As a method to solve this problem, the heatsink 701 is provided on the solid laser crystal as shown in FIG. 7(b). Since the heat generated in the solid laser crystal is sufficiently radiated to the outside through the heatsink 701, miniaturization of the whole laser light source can be achieved.

Figure 8A:
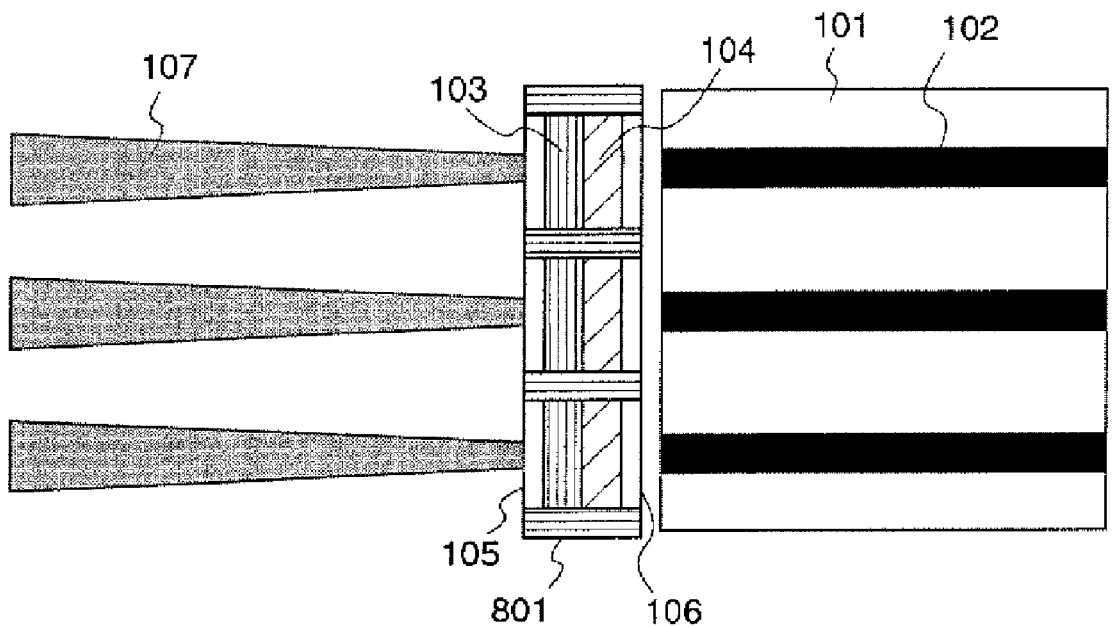
FIG. 8(a) is a top plan view illustrating another example of the laser light source according to the second embodiment.
Figure 8B:
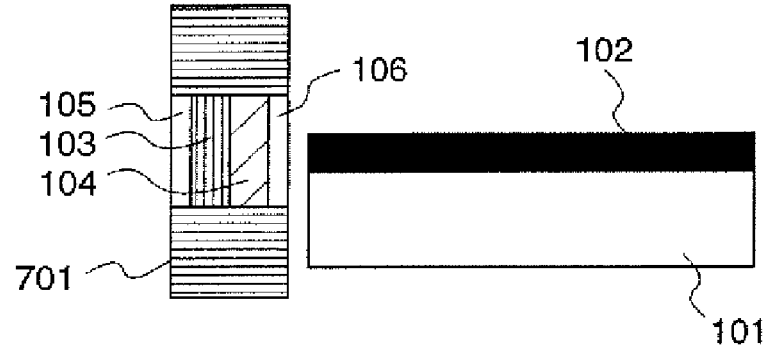
FIG. 8(b) is a front view thereof.

FIG. 8 is a diagram illustrating another example of the construction of the laser light source according to the second embodiment, wherein FIG. 8(a) is a top plan view thereof, and FIG. 8(b) is a front view thereof.

The laser light source shown in FIG. 8 is provided with heatsinks 801 between the respective pump parts 601 in the solid laser crystal 104 in addition to the construction of the laser light source shown in FIG. 7, thereby realizing higher cooling performance. Thereby, further increase in the output power is achieved.

Figure 14:
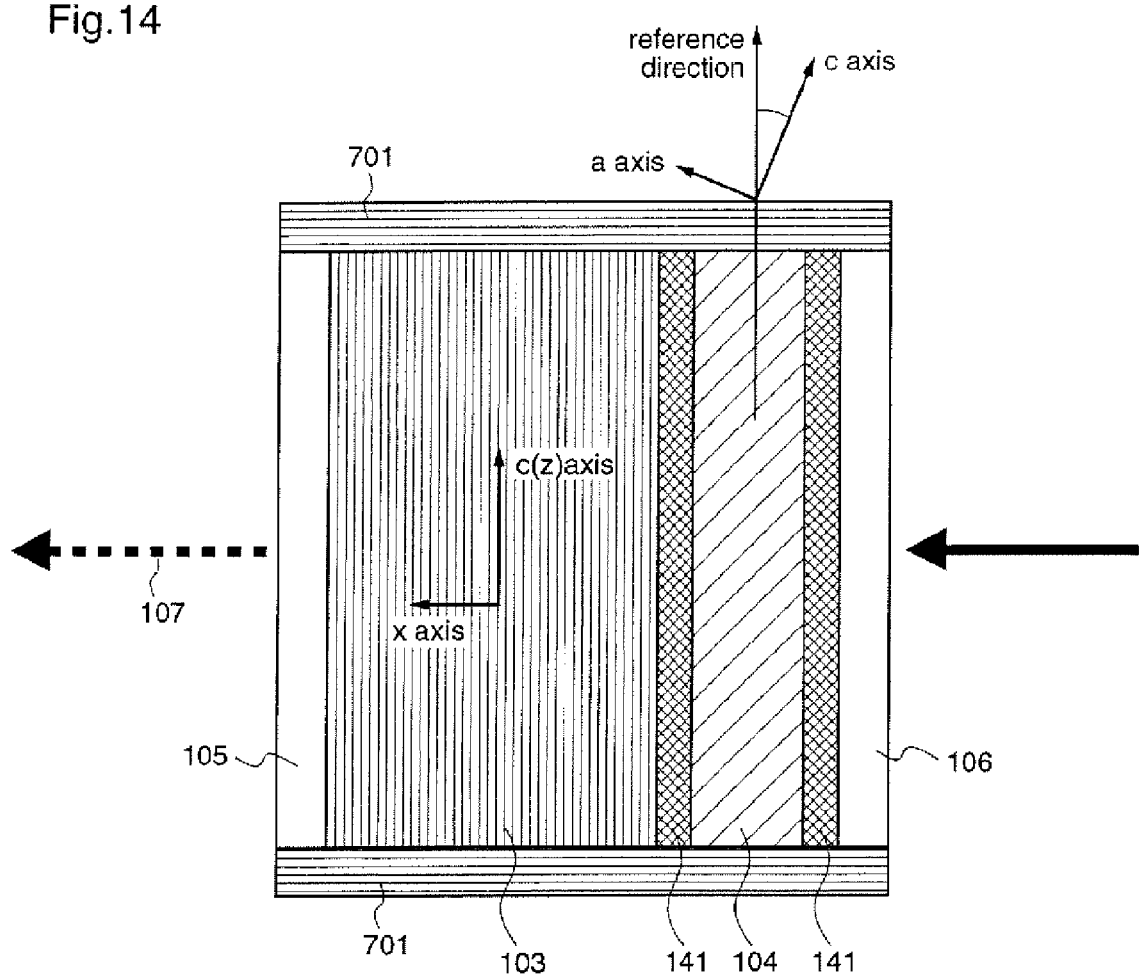
FIG. 14 is a diagram illustrating another example of the laser light source according to the second embodiment.

When the output power is further increased, conduction of heat from the solid laser crystal to the non-linear optical crystal becomes a problem. Since the temperature of the solid laser crystal during laser oscillation rises by ten degrees to several tens of degrees, the characteristics of the solid laser crystal become unstable when the temperature of the non-linear optical crystal is propagated thereto, resulting in a problem that phase mismatch occurs and the output power is reduced. In order to avoid this problem, it is effective to adopt a construction in which a heat separation layer is provided between the solid laser crystal 104 and the non-linear material 103, or a construction in which a material that is transparent and has a high thermal conductivity such as YAG is inserted between these crystals to make the heat escape through the heatsink. For example, as shown in FIG. 14, heatsinks 107 are provided on the both facets of the laser resonator, and heat separation layers 141 are provided sandwiching the solid laser crystal 104, whereby heat generated in the solid laser crystal 104 can be transferred through the heatsink 701 to the outside. When providing the heat separation layers, it is of course possible to adopt a method of inclining the crystal axis of the solid laser crystal in view of the thermal expansion coefficient of the material sandwiched by the heat separation layers, as in the case of the first embodiment where the non-linear optical material and the solid laser crystal are bonded together.

Further, conduction of heat between the semiconductor laser and the solid laser crystal makes the laser oscillation unstable. Therefore, it is desirable to provide a heat separation layer between the heatsink fixed to the semiconductor laser and the heatsink provided on the solid laser crystal. The heat separation layer may be air, but it is desired to fix the heatsinks via a material having a low thermal conductivity such as a ceramic material.

Figure 11A:
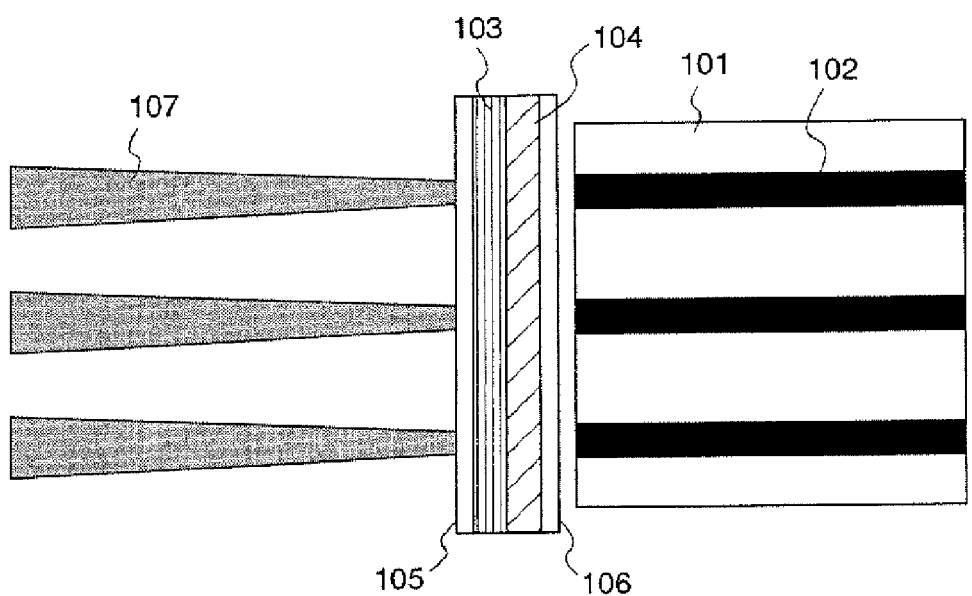
FIG. 11(a) is a top plan view illustrating another example of the laser light source according to the second embodiment.
Figure 11B:
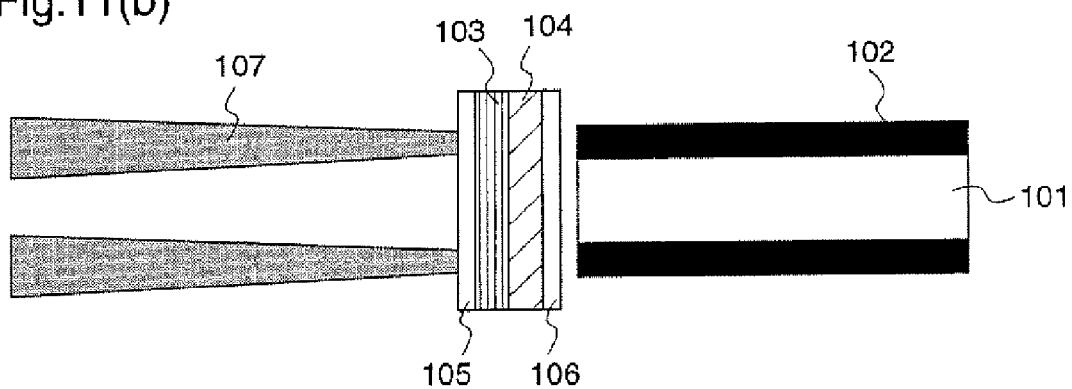
FIG. 11(b) is a front view thereof.
Figure 12A:
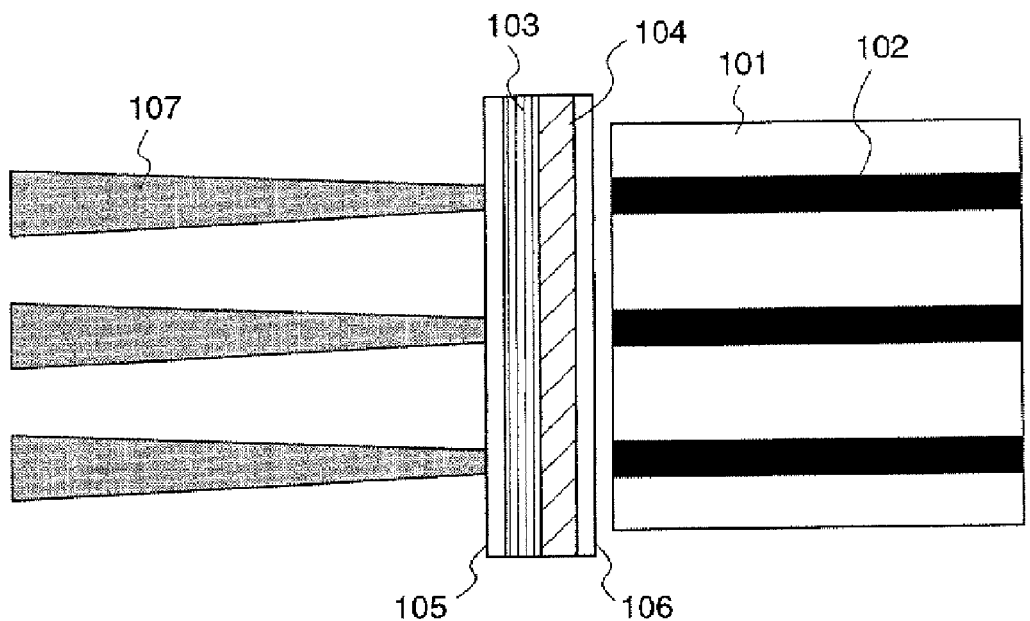
FIG. 12(a) is a top plan view illustrating another example of the laser light source according to the second embodiment.
Figure 12B:
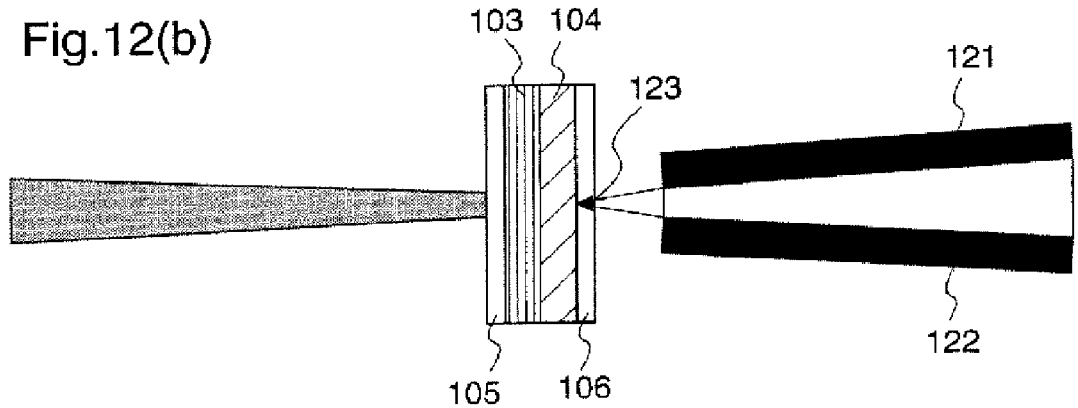
FIG. 12(b) is a front view thereof.

FIG. 11 is a diagram illustrating another example of the construction of the laser light source according to the second embodiment, wherein FIG. 12(a) is a top plan view thereof, and FIG. 12(b) is a front view thereof.

In the laser light source shown in FIG. 11, semiconductor lasers 102 are mounted on and beneath a heatsink 102. Thereby, the mounting density of the semiconductor lasers is increased with a lesser volume, resulting in miniaturization of the highly efficient laser light source.

FIG. 12 is a diagram illustrating another example of the construction of the laser light source according to the second embodiment, wherein FIG. 12(a) is a top plan view thereof, and FIG. 12(b) is a front view thereof.

In the laser light source shown in FIG. 12, front and rear surfaces of a heatsink 101 have angles, and semiconductor lasers 121 and 122 are disposed with the angles on the front and rear surfaces of the heatsink 101. By adopting this construction, the lights emitted from the semiconductor lasers 121 and 122 on the front and rear surfaces can be concentrated to the pump part 123. Thereby, the power density of the pump part can be increased, and high-power laser oscillation can be carried out. A material having a high thermal conductivity is required for the heatsink, and SiC, diamond, Cu alloy, or the like is preferable.

As described above, since the single solid laser crystal 104 is pumped by the plural semiconductor lasers 102 in the laser light source according to the second embodiment, the influence of the thermal lens effect that occurs in the solid laser crystal is controlled, thereby realizing stable and high-power multibeam. Further, since the respective beams can maintain the stable output powers by suppressing the interaction of laser oscillations in the plural pump parts in the solid laser crystal, a more stable light source can be realized.

Further, in the laser light source according to the second embodiment, since the optimum design of the resonator structure is performed using a crystal having a periodic polarization inversion structure such as PPLT, PPKTP, or PPLN as the non-linear optical crystal so that the resonator length becomes 2 mm or less, the longitudinal mode can be further reduced and stabilized.

Embodiment 3

Hereinafter, a laser light source device according to a third embodiment of the present invention will be described.

This third embodiment is characterized by that the angle at which the semiconductor lasers are inclined is made equal to the angle of the crystal axis of the solid laser crystal.

Figure 9A:
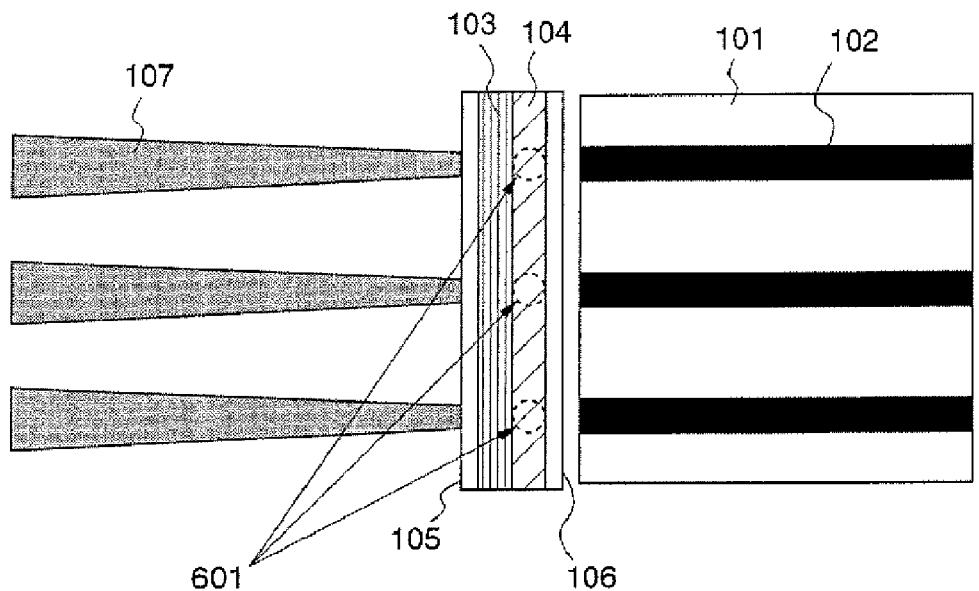
FIG. 9(a) is a top plan view illustrating an example of a laser light source according to a third embodiment of the present invention.
Figure 9B:
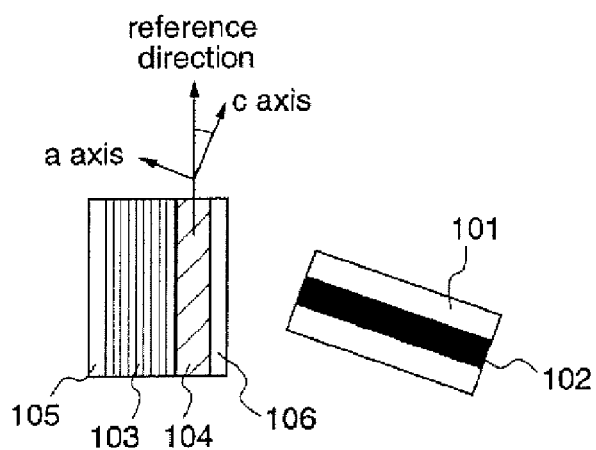
FIG. 9(b) is a front view thereof.

FIG. 9 is a diagram illustrating the construction of the laser light source according to the third embodiment, wherein FIG. 9(a) is a top plan view thereof and FIG. 9(b) is a front view thereof.

The laser light source according to the third embodiment is provided with plural semiconductor laser chips 102, and a laser resonator which is constituted such that a solid laser crystal 104 and a non-linear material 103 are bonded together and reflection coats 106 and 105 are formed at the opposed facets of the respective crystals.

The plural semiconductor laser chips 102 emit pump lights, respectively. The plural semiconductor laser chips 102 are fixed to a heatsink 101 with a solder paste, and are inclined with respect to the facet of the solid laser crystal.

The solid laser crystal 104 has plural pump parts 601 to be pumped by the pump lights emitted from the plural semiconductor laser chips 102.

The non-linear material 103 converts the wavelengths of the plural lights that are pumped by the plural pump parts 601 in the solid laser crystal 104.

The operation of the laser light source according to the third embodiment will be described.

The plural laser lights (having oscillation wavelengths of about 808 nm) emitted from the plural semiconductor lasers 102 pump the plural pump parts 601 in the solid laser crystal 104, and thereby plural lights having wavelengths of about 1.06 μm are generated. Thus generated plural lights are wavelength-converted into higher harmonics by the non-linear material 103, thereby generating green laser lights 107 having wavelengths of 0.53 μm.

Hereinafter, the characteristics of the laser light source according to the third embodiment will be described.

Generally, a microchip laser is constituted such that a facet of a solid laser crystal is directly pumped by light emitted from a semiconductor laser, and it is effective for miniaturization and cost reduction. The interval between the facet of the solid laser crystal and the semiconductor laser is 50 to 100 μm, and the pumping efficiency becomes maximum in a place where the transverse mode of laser oscillation that is pumped in the solid laser is close to the intensity distribution of the pump light from the semiconductor laser. Return light from the laser is a major factor for deterioration of the semiconductor laser. The light reflected at the facet of the solid laser crystal 4 returns to the active layer of the semiconductor laser. When there is such reflected and returned light, the output power of the semiconductor laser becomes unstable, and the lifetime thereof is significantly reduced.

On the other hand, in the third embodiment of the present invention, since the active layer of the semiconductor laser is slightly inclined with respect to the facet of the solid laser crystal, the return light is significantly reduced, and thereby stable output power and long lifetime are achieved. Further, since the beam spot on the solid laser crystal facet is reduced in size, the pumping efficiency can be enhanced.

The angle at which the semiconductor laser 101 is inclined is desired to be 0.5° or larger, and more preferably, it should be 3° or larger. The pumping efficiency can be enhanced by inclining the active layer of the semiconductor laser in the same direction as the direction in which the c axis of the solid laser crystal 104 is inclined with respect to the reference direction. When the semiconductor laser 101 is inclined so that the light emitted from the semiconductor laser 101 is incident on the solid laser crystal 104 in the direction perpendicular to the c axis of the solid laser crystal 104, the absorption efficiency of the pump light is increased, whereby the pumping efficiency can be enhanced.

Figure 9C:
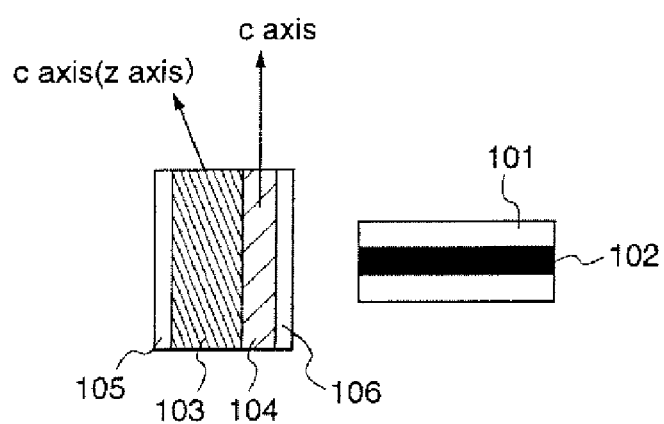
FIG. 9(c) is a front view illustrating another construction of the laser light source according to the third embodiment.

While the case of inclining the semiconductor laser 101 as shown in FIG. 9(b) has been described above, this case is effective only when the inclined angle is up to about 10°. When the semiconductor laser 101 is inclined at more than 10°, it becomes difficult to perform laser oscillation. Accordingly, when the angle at which the semiconductor laser is inclined exceeds 10°, not the semiconductor laser 101 but the polarization inversion structure of the non-linear optical crystal 103 is inclined. To be specific, as shown in FIG. 9(c), the light axis of the non-linear optical crystal 103 is inclined so that the c axis of the solid laser crystal 104 becomes parallel to the facet of the resonator. In this case, since the incident direction of the light emitted from the semiconductor laser 101 can be made perpendicular to the facet of the laser resonator, the laser light 107 emitted from the resonator can be outputted in the direction perpendicular to the facet of the resonator.

As described above, in the laser light source according to the third embodiment, since the semiconductor laser 102 itself is inclined with respect to the facet of the solid laser crystal 104 so that the light emitted from the semiconductor laser 102 is incident on the solid laser crystal 104 in the direction perpendicular to the c axis of the solid laser crystal 104, the return light is significantly reduced, thereby realizing stable output power and long lifetime. Further, since the beam spot on the facet of the solid laser crystal can be reduced in size, the pumping efficiency is enhanced.

Embodiment 4

Hereinafter, a laser light source device according to a fourth embodiment of the present invention will be described.

The solid laser crystal pumped by the semiconductor laser has a problem that the absorption spectrum of the solid laser crystal is narrow and the output power is reduced when the oscillation wavelength of the semiconductor laser deviates from the absorption spectrum of the solid laser crystal due to external temperature variation.

Figure 10A:
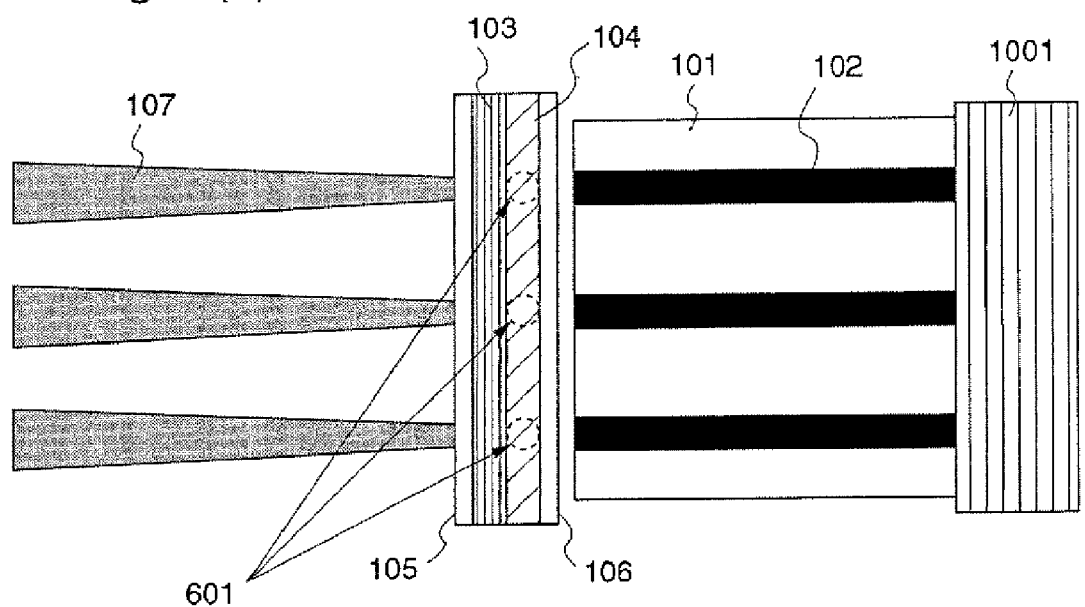
FIG. 10(a) is a top plan view illustrating an example of a laser light source according to a fourth embodiment of the present invention.
Figure 10B:
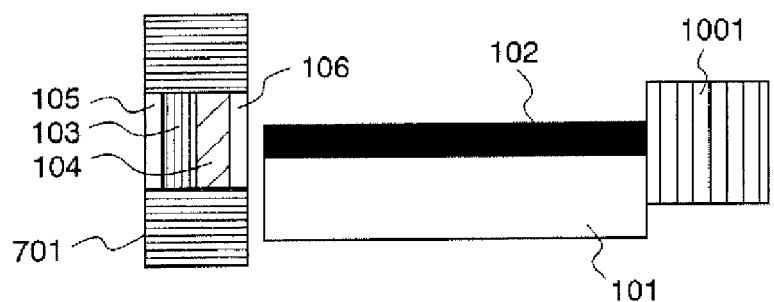
FIG. 10(b) is a front view thereof.

FIG. 10 is a diagram illustrating the construction of the laser light source according to the fourth embodiment, wherein FIG. 10(a) is a top plan view thereof and FIG. 10(b) is a front view thereof.

The laser light source according to the fourth embodiment is provided with plural semiconductor laser chips 102, and a laser resonator which is constituted such that a solid laser crystal 104 and a non-linear material 103 are bonded together, and reflection coatings 106 and 105 are formed at the opposed facets of the respective crystals.

The plural semiconductor laser chips 102 emit pump lights, respectively. The plural semiconductor laser chips 102 are fixed to a heatsink 101 with a solder paste, and a volume grating 1001 is provided on the rear facets thereof.

The solid laser crystal 104 has plural pump parts 601 to be pumped by the pump lights emitted from the plural semiconductor laser chips 102.

The non-linear material 103 converts the wavelengths of the plural lights that are pumped by the plural pump parts 601 in the solid laser crystal 104.

The operation of the laser light source according to the fourth embodiment will be described.

The plural laser lights (having oscillation wavelengths of about 808 nm) emitted from the plural semiconductor lasers 102 pump the plural pump parts 601 in the solid laser crystal 104, and thereby plural lights having wavelengths of about 1.06 µm are generated. Thus generated plural lights are wavelength-converted into higher harmonics by the non-linear material 103, thereby generating green laser lights 107 having wavelengths of 0.53 µm.

Hereinafter, the characteristics of the laser light source according to the fourth embodiment will be described.

In this fourth embodiment, the volume grating 1001 is provided on the rear facets of the semiconductor lasers 102, i.e., the rear surface of the laser light source. Since the semiconductor lasers 102 are fixed to a Bragg wavelength from the volume grating 1001, the wavelengths thereof do not vary even when the external temperature varies. Therefore, stable pumping of the solid laser can be realized, and variation in the output power due to the external temperature variation can be significantly reduced. Further, the construction of inclining the semiconductor lasers with respect to the facet of the solid laser crystal 104 as shown in FIG. 9(b) is more effective in this construction. Usually, when the oscillation wavelengths of the semiconductor lasers are fixed by the diffracted light from the grating, if return light from another reflection surface is incident on the semiconductor lasers, stable fixing of the wavelengths becomes difficult. However, since such return light from the facet of the solid laser crystal 104 into the semiconductor lasers can be reduced by inclining the semiconductor lasers with respect to the facet of the solid laser crystal 104, the oscillation wavelengths of the semiconductor lasers can be fixed with stability.

As described above, in the laser light source according to the fourth embodiment, since the wavelength widths of the pump lights are narrowed by providing the volume grating 1001 on the rear facets of the semiconductor laser chips 102, the output power can be increased, and the oscillation of the solid laser crystal can be stabilized against the external temperature change. Further, since the return light from the facet of the solid laser crystal to the semiconductor lasers can be reduced by inclining the semiconductor lasers 102 with respect to the facet of the solid laser crystal 104, the oscillation wavelengths of the semiconductor lasers can be stably fixed.

Embodiment 5

Hereinafter, a display device according to a fifth embodiment of the present invention will be described.

FIG. 1(b) is a front view illustrating the schematic construction of the display device according to the fifth embodiment of the present invention.

The display device according to the fifth embodiment comprises at least two laser light sources 108 of the present invention, a rod prism 110 as a uniformization optical system for shaping the respective laser beams from the plural laser light sources 108, an optical element 109 for modulating at least one of deflection, phase, and polarization of each laser light incident on the rod prism, a collimator optical system (not shown) for collimating the plural laser beams shaped by the rod prism 110, and a two-dimensional image conversion device (SLM) 111 for converting the plural laser beams collimated by the collimator optical system into a two-dimensional image. The laser light sources 108 are any of those described for the first to fourth embodiments, and particularly, desired to be the plural pumping semiconductor laser light sources as shown in FIG. 4.

Next, the operation of the display device according to the fifth embodiment will be described.

The light 107 emitted from the laser light source 108 is incident on the rod prism 110 after passing through the optical element 109, and the in-plane intensity distribution of the light 107 is shaped into a rectangle in the rod prism 110, and thereafter, the light is converted into an image by the SLM 111 as a two-dimensional image conversion switch, and projected by the lens 112.

Hereinafter, the reasons why the laser light source of the present invention is effective for the display device will be described.

The first reason is that the laser light source is excellent in high power and stable characteristics, and the second reason is that it has less speckle noise.

Hereinafter, reduction of speckle noise will be described in detail, while the high power and stable characteristics will be described later when describing the features of the laser light source.

The speckle noise is a phenomenon in which interference patterns of coherent light such as laser light occur, and the speckle noise causes deterioration of image quality when laser light is applied to a display or the like. In order to reduce this problem, the display device of the present invention adopts the optical element 109. The optical element 109 is a micro structure element having a variable refractive index, wherein a liquid crystal is confined in a pattern structure, and an AC current is applied to temporally vary the refractive index, thereby varying the deflection and phase of light. This construction enables reduction of speckle noise in the laser light. This speckle noise reduction is based on a method of temporally varying the interference patterns, that is, a method of rapidly changing the plural interference patterns to average the patterns so that the patterns are seemed as a smooth image in human eyes. In this method, the laser light source of the present invention is effective. Since the plural beams exist at intervals in the multibeam structure, the laser lights are incident on the rod prism 101 at different angles. When the lights from the plural laser light sources are incident on the prism at the different angles, the interference patterns of the lights on the screen are complicated, and thereby speckles are multiplexed and the speckle suppression effect is enhanced.

Further, a method of emitting plural laser lights with different frequencies for the respective colors of R, G, and B is also effective for varying the interference patterns. For example, when performing full-color display by using one SLM, a method called "field sequential" for making the R, G, and B light sources emit lights with plural periods within one field of 60 Hz is adopted. In this case, the frequencies of the laser lights must be sufficiently shorter than the periods of the field sequential drive, which can be realized by modulating the pumping semiconductor lasers.

Further, the reflection coats of the solid laser crystal are designed such that the reflection coat 106 totally reflects the green light while the reflection coat 105 transmits the green light. Thereby, the laser light 107 is obtained as the sum of the light that is directly outputted from the non-linear optical crystal 103 and the light that is once reflected at the reflection coat 106. Therefore, each laser beam is composed of two beams, and the intensity distributions of these beams are shaped in the rod prism to form more complicated interference patterns, thereby effectively reducing the speckle noise.

Further, when the respective beams are designed such that the beam intervals are different from each other, the speckle noise is further suppressed. As a difference in the beam intervals, a difference larger than the oscillation wavelength is required. Since the wavelength of the fundamental wave is about 1 μm to the SHG of the green light, it is desired that the beam intervals are different from each other by about 1 μm or more.

Further, the display device using the laser light source comprising plural laser beams according to the present invention can realize high reliability. By preparing plural pumping semiconductor lasers and plural solid laser parts, even when one of the lasers is deteriorated, the other lasers can compensate for the output power of the deteriorated laser. Therefore, it is effective for increasing the lifetime and reliability of the display. Further, by giving a margin to the maximum value that can be outputted from one laser light source, the entire lifetime is increased. Further, even if any of the lasers is deteriorated, the luminance can be maintained by increasing the output power of the other lasers. Further, spare lasers may be provided to compensate for the entire output power when some of the lasers are deteriorated. In this way, the reliability of the light source for display can be significantly increased by adopting the multibeam structure.

As described above, the display device according to the fifth embodiment is provided with at least two semiconductor lasers 108 of the present invention which are described for the first to fourth embodiments, the rod prism 110 for shaping the respective laser beams from the plural laser light sources 108, the optical element 109 for modulating at least one of deflection, phase, and polarization of each laser light incident on the rod prism 110, and the SLM 111 for collimating the plural laser beams shaped by the rod prism 110 with the collimator optical system and converting the laser beams into a two-dimensional image, and the in-plane intensity distributions of the plural laser beams emitted from the laser light sources 108 are uniformized by the rod prism 110, and then the laser beams are converted into an image by the SLM 111. Therefore, reduction in speckle noise as well as stabilization of the output power can be achieved, thereby realizing a high-definition display.

APPLICABILITY IN INDUSTRY

According to the present invention, in a laser light source having a construction wherein a solid laser crystal to be pumped by a semiconductor laser and a wavelength conversion element are combined such that the solid laser crystal and a non-linear optical crystal are bonded together, beams can maintain stable output powers, thereby realizing a light source having higher stability and reliability. In addition, since the reliability of the light source can be enhanced, a laser display device of higher reliability can be provided.

The invention claimed is:

1. A laser light source comprising:
a semiconductor laser for outputting pump light, and
a laser resonator comprising a solid laser crystal and a non-linear optical crystal bonded to each other, and a first reflection layer and a second reflection layer located on opposite surfaces of the crystals, wherein the solid laser crystal is pumped by the pump light emitted from the semiconductor laser, and the non-linear optical crystal is for converting a wavelength of light emitted from the solid laser crystal, wherein
the solid laser crystal comprises $Gd_xY_{1-x}VO_4$ wherein $0 \leq x \leq 1$;
the non-linear optical crystal comprises $LiNbO_3$ or $LiTaO_3$;
a c axis which is a crystal axis of the solid laser crystal is inclined with respect to a z axis of the non-linear optical crystal within a z-x plane of the non-linear optical crystal, wherein the inclination of the c axis is within a range from 0.5° to 10°;
a perpendicular line of the c axis is approximately parallel to an emission direction of a laser beam from the pump semiconductor laser; and
the pump semiconductor laser emits green light of 300 mW or more, which is continuous light.

2. A laser light source as defined in claim 1 wherein the total of the thicknesses of the solid laser crystal and the non-linear optical crystal is 2 mm or less, and the length of the laser resonator is 2 mm or less.

3. A laser light source as defined in claim 1 wherein the width of an active layer of the semiconductor laser is 50 μm or less.

4. A laser light source as defined in claim 1 wherein
the semiconductor laser is fixed to a heatsink, and the solid laser crystal of the laser resonator is connected to another heatsink; and
a heat separation layer is between the heatsink to which the semiconductor laser is fixed and the heatsink connected to the solid laser crystal of the laser resonator.

5. A laser light source as defined in claim 1 further including a volume grating on a rear surface of the semiconductor laser.

6. A laser light source as defined in claim 1 wherein the solid laser crystal and the non-linear optical crystal are optically contacted to each other.

7. A laser light source as defined in claim 1 wherein the solid laser crystal comprises $Nd:YVO_4$ having a Nd doping amount of 2.5 at % or more and a crystal thickness of 0.5 mm or less.

8. A laser light source as defined in claim 1 wherein the solid laser crystal comprises $Nd:GdVO_4$ having a Nd doping amount of 2.5 at % or more and a crystal thickness of 0.5 mm or less.

9. A laser light source as defined in claim 1 wherein the non-linear optical crystal comprises $LiNbO_3$ including any of Mg, Zn, In, and Sc and having a periodical polarization inversion structure, and a thickness of 1 mm or less.

10. A laser light source as defined in claim 9 wherein the period of the polarization inversion structure formed on the non-linear optical crystal has a distribution within the plane.

11. A laser light source as defined in claim 1 wherein any opposed side surfaces of the solid laser crystal are nonparallel.

12. A laser light source as defined in claim 1 which outputs green light of 200 mW or more.

13. A laser light source comprising:
a plurality of semiconductor lasers each outputting pump light, and
a laser resonator comprising a solid laser crystal and a non-linear optical crystal bonded to each other, and a first reflection layer and a second reflection layer located on opposite surfaces of the crystals, wherein the solid laser crystal has a plurality of pump parts pumped by the pump lights emitted from the plurality of semiconductor lasers, and the non-linear optical crystal is for converting wavelengths of a plurality of lights pumped by the pump parts in the solid laser crystal, wherein
the solid laser crystal comprises $Gd_xY_{1-x}VO_4$;
the non-linear optical crystal comprises $LiNbO_3$ or $LiTaO_3$;
a c axis which is a crystal axis of the solid laser crystal is inclined with respect to a z axis of the non-linear optical crystal within a z-x plane of the non-linear optical crystal, wherein the inclination of the c axis is within a range from 0.5° to 10°;

a perpendicular line of the c axis is approximately parallel to an emission direction of a laser beam from each pump semiconductor laser; and each pump semiconductor laser emits green light of 300 mW or more, which is continuous light.

14. A laser light source as defined in claim 13 wherein the plurality of pump parts in the solid laser crystal are separated from each other by 200 μm or more.

15. A laser light source as defined in claim 13 wherein the intervals between the plurality of pump parts in the solid laser crystal are different from each other.

16. A laser light source as defined in claim 13 further including a heatsink having a surface on which steps are formed, wherein at least two semiconductor lasers among the plurality of semiconductor lasers, are located on the steps of the heatsink which have different heights.

17. A laser light source as defined in claim 13 wherein the plurality of semiconductor lasers is fixed to a heatsink, and the solid laser crystal of the laser resonator is connected to another heatsink; and a heat separation layer is between the heatsink to which the semiconductor lasers are fixed and the heatsink connected to the solid laser crystal of the laser resonator.

18. A laser light source as defined in claim 13 wherein the laser resonator has heatsink parts between the plurality of pump parts.

19. A laser light source as defined in claim 13 further including grooves between the pump parts in the solid laser crystal.

20. A laser light source as defined in claim 19 wherein the grooves and the surfaces of the solid laser crystal are nonparallel.

21. A display device comprising:

a plurality of laser light sources, each comprising:

a semiconductor laser for outputting pump light, and a laser resonator comprising a solid laser crystal and a non-linear optical crystal bonded to each other, and a first reflection layer and a second reflection layer located on opposite surfaces of the crystals, wherein the solid laser crystal is pumped by pump light emitted from the semiconductor laser, and the non-linear optical crystal is for converting a wavelength of light emitted from the solid laser crystal, wherein the solid laser crystal comprises $Gd_xV_{1-x}VO_4$ wherein $0 \leq x \leq 1$;

the non-linear optical crystal comprises $LiNbO_3$ or $LiTaO_3$, a c axis, which is a crystal axis, of the solid laser crystal is inclined within a range from 0.5° to 10° with respect to a z axis of the non-linear optical crystal within a z-x plane of the non-linear optical crystal;

a line perpendicular to the c axis is approximately parallel to an emission direction of a laser beam from the pump semiconductor laser; and the pump semiconductor laser emits continuous green light of 300 mW or more, a uniformization optical system for shaping laser beams emitted from the plurality of laser light sources, a collimator optical system for collimating the plurality of laser beams shaped by the uniformization optical system, and a two-dimensional image conversion device for converting the plurality of laser beams collimated by the collimator optical system into a two-dimensional image.

22. A display device as defined in claim 21 wherein the uniformization optical system comprises a rod prism.

23. A display device as defined in claim 22, further including an optical element for modulating at least one of a deflection, a phase, and a polarization of the laser light incident on the rod prism.

* * * * *